US012790354B2

(12) United States Patent
Seifermann et al.

(10) Patent No.: US 12,790,354 B2
(45) Date of Patent: Nov. 10, 2026

(54) ORGANIC MOLECULES FOR OPTOELECTRONIC DEVICES

(71) Applicant: Samsung Display Co., Ltd., Yongin-si (KR)

(72) Inventors: Stefan Seifermann, Bühl (DE); Sebastian Dück, Heidelberg (DE)

(73) Assignee: Samsung Display Co., Ltd., Yongin-si (KR)

( * ) Notice: Subject to any disclaimer, the term of this patent is extended or adjusted under 35 U.S.C. 154(b) by 945 days.

(21) Appl. No.: 17/998,918

(22) PCT Filed: May 14, 2021

(86) PCT No.: PCT/EP2021/062821
§ 371 (c)(1),
(2) Date: Nov. 15, 2022

(87) PCT Pub. No.: WO2021/229050
PCT Pub. Date: Nov. 18, 2021

(65) Prior Publication Data

US 2023/0200237 A1 Jun. 22, 2023

(30) Foreign Application Priority Data

May 15, 2020 (EP) ..................................... 20175022

(51) Int. Cl.
*C07F 5/02* (2006.01)
*C09K 11/06* (2006.01)
*H10K 71/16* (2023.01)
*H10K 85/60* (2023.01)
*H10K 50/11* (2023.01)

(52) U.S. Cl.
CPC .............. *C07F 5/027* (2013.01); *C09K 11/06* (2013.01); *H10K 71/164* (2023.02); *H10K 85/658* (2023.02); *C09K 2211/1011* (2013.01); *H10K 50/11* (2023.02)

(58) Field of Classification Search
None
See application file for complete search history.

(56) References Cited

U.S. PATENT DOCUMENTS

2019/0211038 A1 7/2019 Xia
2020/0176691 A1* 6/2020 Yam ........................ C07F 15/04
2022/0271225 A1 8/2022 Shim et al.

FOREIGN PATENT DOCUMENTS

CN 110003254 A 7/2019
KR 10-2018-0120619 A 11/2018
WO WO 2021/015417 A1 1/2021

OTHER PUBLICATIONS

International Search Report and Written Opinion of PCT/EP2021/062821, Aug. 20, 2021, 12 pages.
Xiao Liang et al., "*Peripheral Amplification of Multi-Resonance Induced Thermally Activated Delayed Fluorescence for Highly Efficient OLEDs*", Angewandte Chemie International Edition, Wiley Online Library, 2018, pp. 11316-11320, vol. 57, Wiley-VCH Verlag GmbH & Co. KGaA, Weinheim.

* cited by examiner

*Primary Examiner* — Robert S Loewe
(74) *Attorney, Agent, or Firm* — Womble Bond Dickinson (US) LLP

(57) ABSTRACT

The invention relates to an organic molecule for use in optoelectronic devices. The organic molecule has a structure of Formula I:

Formula I

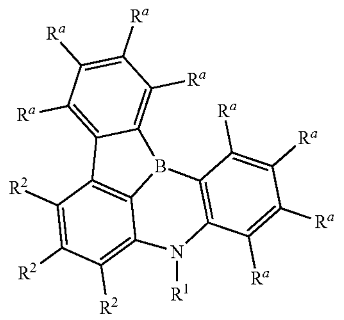

wherein, $R^a$ and $R^2$ are independently selected from the group consisting of: hydrogen, deuterium, $N(R^5)_2$, $OR^5$, $SR^5$, $Si(R^5)_3$, $B(OR^5)_2$, $OSO_2R^5$, $CF_3$, CN, halogen, $C_1$-$C_{40}$-alkyl, $C_1$-$C_{40}$-alkoxy, $C_1$-$C_{40}$-thioalkoxy, $C_2$-$C_{40}$-alkenyl, $C_2$-$C_{40}$-alkynyl, $C_6$-$C_{60}$-aryl, and $C_3$-$C_{57}$-heteroaryl, and $R^1$ is a $C_{10}$-$C_{60}$-polycyclic aryl group.

18 Claims, No Drawings

ORGANIC MOLECULES FOR OPTOELECTRONIC DEVICES

CROSS-REFERENCE TO RELATED APPLICATIONS

This application is a U.S. National Phase Patent Application of International Patent Application Number PCT/EP2021/062821, filed on May 14, 2021, which claims priority to European Patent Application Number 20175022.1, filed on May 15, 2020, the entire contents of all of which are incorporated herein by reference.

The invention relates to organic light-emitting molecules and their use in organic light-emitting diodes (OLEDs) and in other optoelectronic devices.

The object of the present invention is to provide molecules which are suitable for use in optoelectronic devices.

This object is achieved by the invention which provides a new class of organic molecules.

According to the invention the organic molecules are purely organic molecules, i.e., they do not contain any metal ions in contrast to metal complexes known for the use in optoelectronic devices. The organic molecules of the invention, however, include metalloids, in particular B, Si, Sn, Se, and/or Ge.

According to the present invention, the organic molecules exhibit emission maxima in the blue, sky-blue or green spectral range. The organic molecules exhibit in particular emission maxima between 420 nm and 520 nm, preferably between 440 nm and 495 nm, more preferably between 450 nm and 470 nm. The photoluminescence quantum yields of the organic molecules according to the invention are, in particular, 50% or more. The excited state lifetime is not more than 10 μs. The use of the molecules according to the invention in an optoelectronic device, for example an organic light-emitting diode (OLED), leads to higher efficiencies or higher color purities, expressed by the full width at half maximum (FWHM) of the emission spectrum, of the device. Corresponding OLEDs have a higher stability than OLEDs with known emitter materials and comparable colors.

The organic molecules according to the invention include or consist of a structure of Formula I Formula I

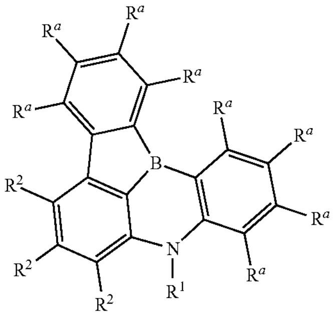

wherein $R^1$ is selected from the group consisting of a $C_{10}$-$C_{60}$-polycyclic aryl group, which is optionally substituted with one or more substituents $R^4$;

$R^a$ and $R^2$ are at each occurrence independently selected from the group consisting of:

hydrogen, deuterium, $N(R^3)_2$, $OR^3$, $SR^3$, $Si(R^3)_3$, $B(OR^3)_2$, $OSO_2R^3$, $CF_3$, CN, halogen;

$C_1$-$C_{40}$-alkyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_1$-$C_{40}$-thioalkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-aryl, which is optionally substituted with one or more substituents $R^3$; and $C_3$-$C_{57}$-heteroaryl, which is optionally substituted with one or more substituents $R^3$;

$R^3$ is independently selected from the group consisting of:

hydrogen, deuterium, $N(R^4)_2$, $OR^4$, $SR^4$, $Si(R^4)_3$, $B(OR^4)_2$, $OSO_2R^4$, $CF_3$, CN, halogen;

$C_1$-$C_{40}$-alkyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C═O, C═S, C═Se, $C{=}NR^4$, $P({=}O)(R^4)$, SO, $SO_2$, $NR^4$, O, S or $CONR^4$;

$C_1$-$C_{40}$-alkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C═O, C═S, C═Se, $C{=}NR^4$, $P({=}O)(R^4)$, SO, $SO_2$, $NR^4$, O, S or $CONR^4$;

$C_1$-$C_{40}$-thioalkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C═O, C═S, C═Se, $C{=}NR^4$, $P({=}O)(R^4)$, SO, $SO_2$, $NR^4$, O, S or $CONR^4$;

$C_2$-$C_{40}$-alkenyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C═O, C═S, C═Se, $C{=}NR^4$, $P({=}O)(R^4)$, SO, $SO_2$, $NR^4$, O, S or $CONR^4$;

$C_2$-$C_{40}$-alkynyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C═O, C═S, C═Se, $C{=}NR^4$, $P({=}O)(R^4)$, SO, $SO_2$, $NR^4$, O, S or $CONR^4$;

$C_6$-$C_{60}$-aryl, which is optionally substituted with one or more substituents $R^4$; and $C_3$-$C_{57}$-heteroaryl, which is optionally substituted with one or more substituents $R^4$;

$R^4$ is at each occurrence independently from one another selected from the group consisting of:

hydrogen, deuterium, halogen, OPh (Ph=phenyl), SPh, $CF_3$, CN, $Si(C_1$-$C_5$-alkyl$)_3$, $Si(Ph)_3$;

$C_1$-$C_5$-alkyl, wherein optionally one or more hydrogen atoms are independently substituted by deuterium, halogen, CN, or $CF_3$;

$C_1$-$C_5$-alkoxy, wherein optionally one or more hydrogen atoms are independently substituted by deuterium, halogen, CN, or $CF_3$;

$C_1$-$C_5$-thioalkoxy, wherein optionally one or more hydrogen atoms are independently substituted by deuterium, halogen, CN, or $CF_3$;

$C_2$-$C_5$-alkenyl, wherein optionally one or more hydrogen atoms are independently substituted by deuterium, halogen, CN, or $CF_3$;

$C_2$-$C_5$-alkynyl, wherein optionally one or more hydrogen atoms are independently substituted by deuterium, halogen, CN, or $CF_3$;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl), wherein adjacent groups $R^a$ optionally are bonded to each other and form an aryl or heteroaryl ring, which is optionally substituted with one or more $C_1$-$C_5$-alkyl substituents, deuterium, halogen, CN or $CF_3$; and wherein adjacent groups $R^2$ optionally are bonded to each other and form an aryl or heteroaryl ring, which is optionally substituted with one or more $C_1$-$C_5$-alkyl substituents, deuterium, halogen, CN or $CF_3$.

Examples of the organic molecules are listed below:

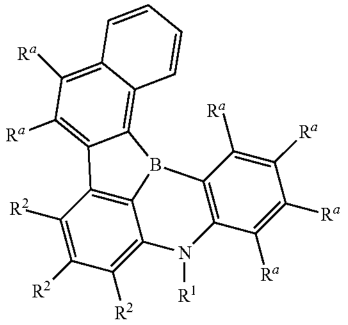

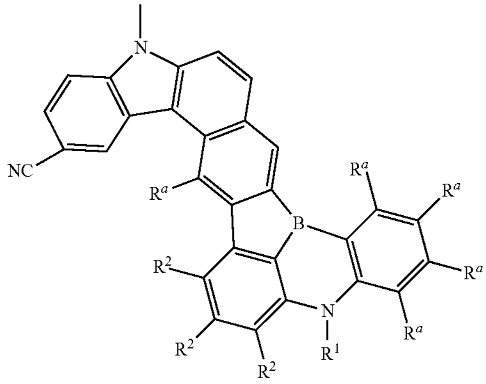

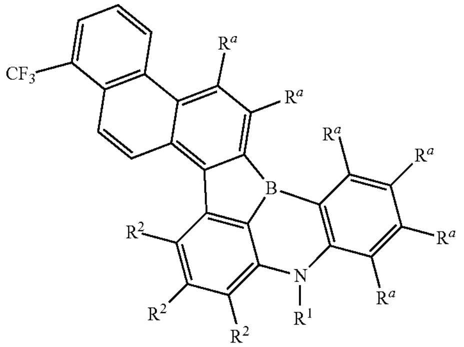

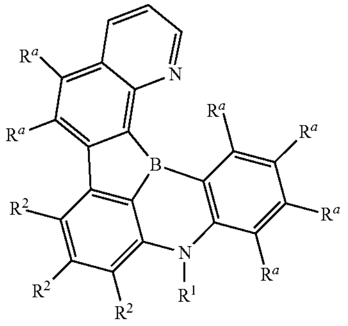

-continued

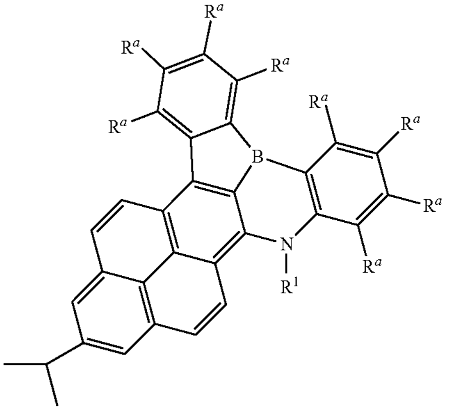

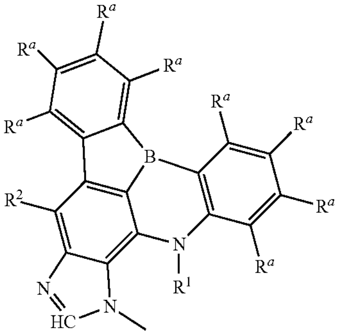

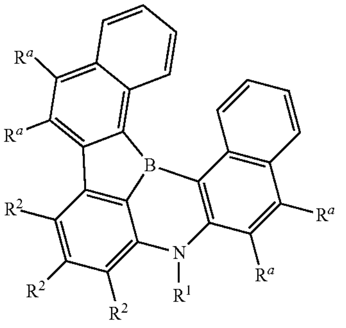

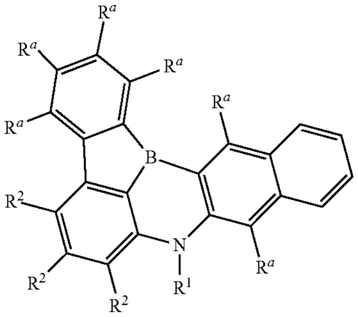

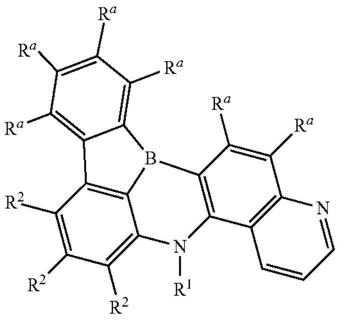

-continued

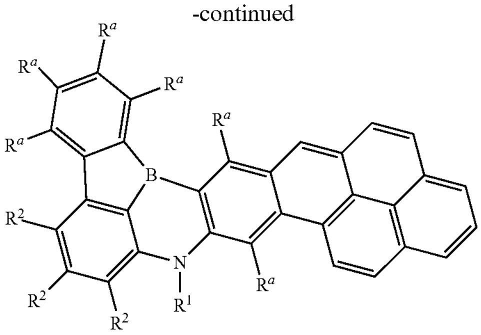

In the organic molecule, at least one hydrogen atom may be substituted by a halogen atom or a deuterium atom.

In one embodiment of the invention, $R^a$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In further embodiments of the invention, $R^a$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In one embodiment of the invention, $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In further embodiments of the invention, $R^2$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In certain embodiments of the invention, the organic molecule includes or consists of a structure selected from the group consisting of Formulae I-Ia, I-Ib, and I-Ic:

Formula I-Ia

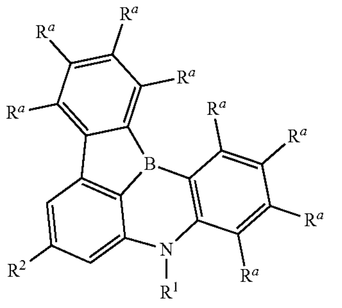

Formula I-Ib

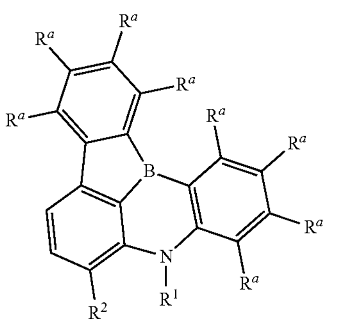

-continued

Formula I-Ic

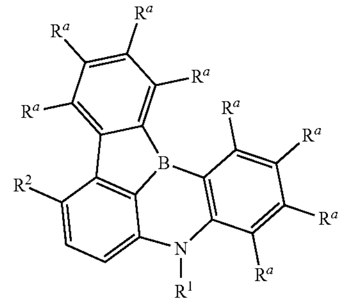

wherein $R^2$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule includes or consists of a structure selected from the group consisting of Formulae I-Ia, I-Ib, and I-Ic, wherein $R^2$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In another embodiment of the invention, $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, which may be substituted with one or more substituents $R^4$.

In a further embodiment of the invention, $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a further embodiment of the invention, $R^1$ is selected from the group consisting of:

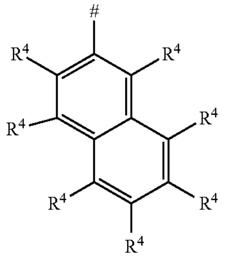

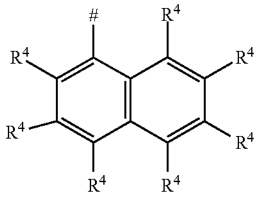

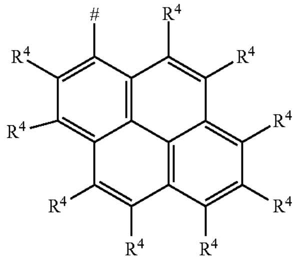

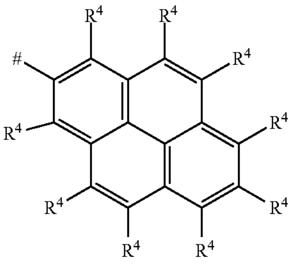

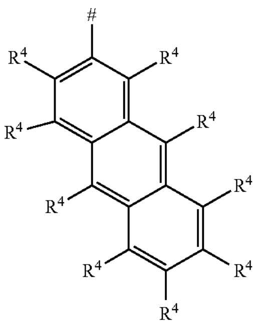

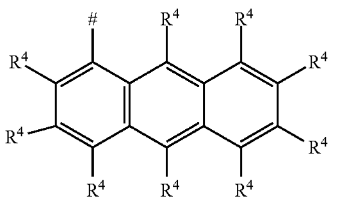

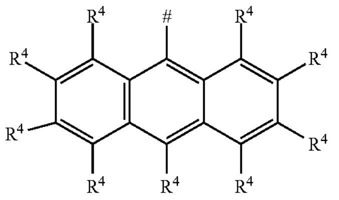

-continued

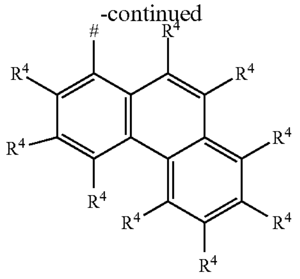

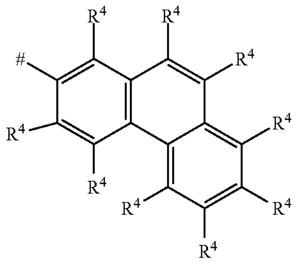

wherein #is the binding site.

In a preferred embodiment of the invention, $R^1$ represents a pyrene group, which is optionally substituted with one or more substituents $R^4$. The pyrene group may be bound at any suitable position to the N atom shown in Formula I.

Below, examples for the pyrene moiety are shown:

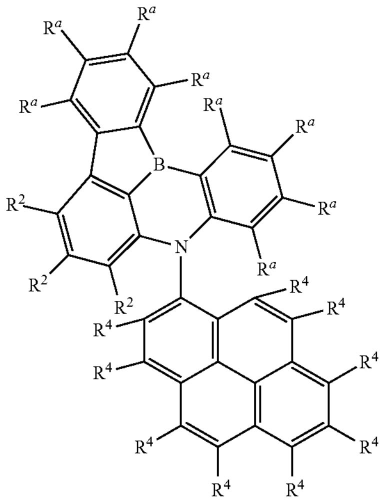

-continued

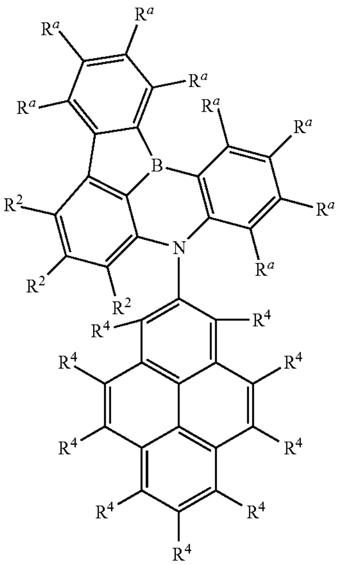

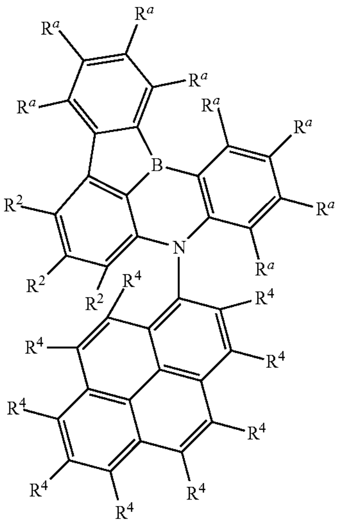

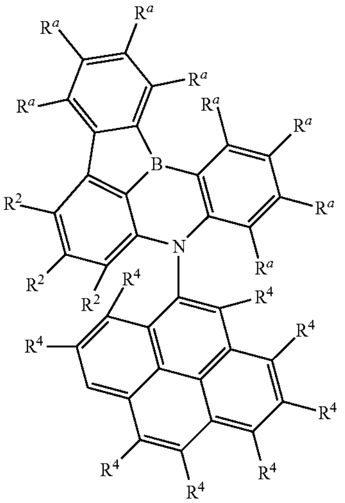

-continued

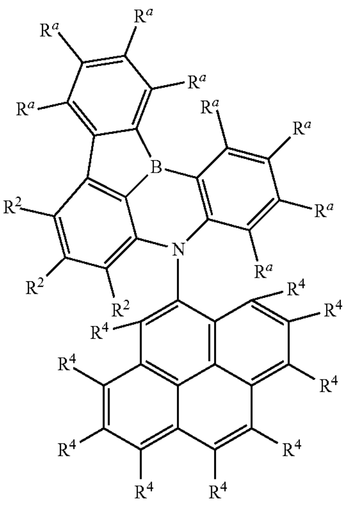

In certain embodiments of the invention, $R^1$ represents a pyrene group, which is optionally substituted with one or more substituents independently from each other selected from the group consisting of hydrogen (H), methyl (Me), i-propyl ($CH(CH_3)_2$) ($^iPr$), t-butyl ($^tBu$), phenyl (Ph), CN, $CF_3$, and diphenylamine ($NPh_2$).

In further embodiments of the invention, the organic molecule includes (or consists of) a structure selected from the group consisting of Formulae Ia, Ib, Ic and Id:

Formula Ia

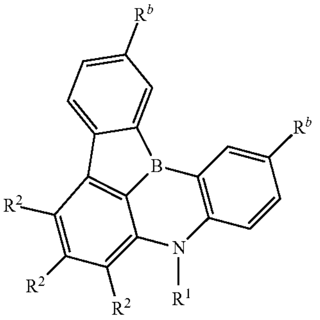

Formula Ib

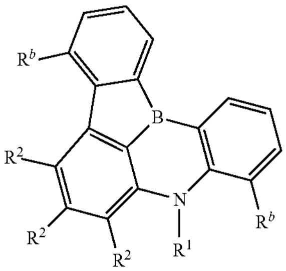

-continued

Formula Ic

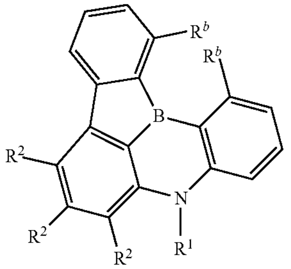

Formula Id

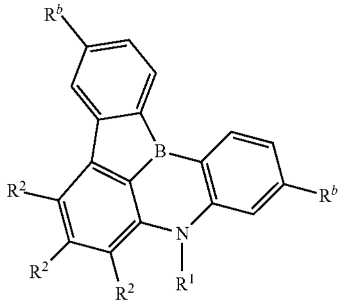

wherein $R^b$ is at each occurrence independently selected from the group consisting of:

hydrogen, deuterium, $N(R^3)_2$, $OR^3$, $SR^3$, $Si(R^3)_3$, $B(OR^3)_2$, $OSOR^3$, $CF_3$, CN, halogen;

$C_1$-$C_{40}$-alkyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_1$-$C_{40}$-thioalkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_6$-$C_{60}$-aryl, which is optionally substituted with one or more substituents $R^3$; and $C_3$-$C_{57}$-heteroaryl, which is optionally substituted with one or more substituents $R^3$.

In one embodiment, the organic molecule includes or consists of a structure of Formula Ia, Ib, Ic or Id, wherein $R^b$ is independently selected from the group consisting of:

hydrogen, Me, $^i$Pr, $^t$Bu, CN, $CF_3$;

Ph, which is optionally substituted with one or more substituents independently from each other selected from the group consisting of Me, $^i$Pr, $^t$Bu, CN, $CF_3$, and Ph;

pyridinyl, which is optionally substituted with one or more substituents independently from each other selected from the group consisting of Me, $^i$Pr, $^t$Bu, CN, $CF_3$, and Ph;

carbazolyl, which is optionally substituted with one or more substituents independently from each other selected from the group consisting of Me, $^i$Pr, $^t$Bu, CN, $CF_3$, and Ph;

triazinyl, which is optionally substituted with one or more substituents independently from each other selected from the group consisting of Me, $^i$Pr, $^t$Bu, CN, $CF_3$, and Ph; and $N(Ph)_2$.

In a further embodiment of the invention, the organic molecule includes or consists of a structure of Formula Ia, Ib, Ic or Id, wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a further embodiment of the invention, the organic molecule includes or consists of a structure of Formula Ia, Ib, Ic or Id, wherein $R^b$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ia, Ib, Ic or Id, wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ia, Ib, Ic or Id, wherein $R^b$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Ia, Ib, Ic or Id, wherein $R^b$ is identical at each occurrence.

In one embodiment of the invention, the organic molecule includes or consists of a structure of Formula Ia, Ib, Ic or Id, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention, the organic molecule includes or consists of a structure of Formula Ia, Ib, Ic or Id, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a preferred embodiment of the invention, the organic molecule includes or consists of a structure of Formula Ia-1, Ia-2, Ia-3, Ib-1, Ib-2, Ib-3, Ic-1, Ic-2, Ic-3, Id-1, Id-2, or Id-3:

Ia-1

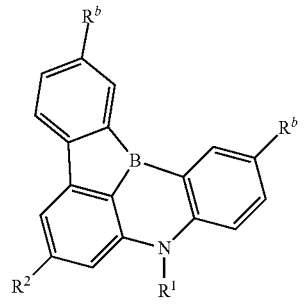

Ia-2

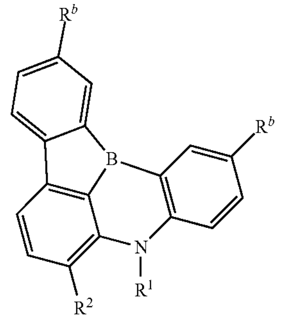

Ia-3

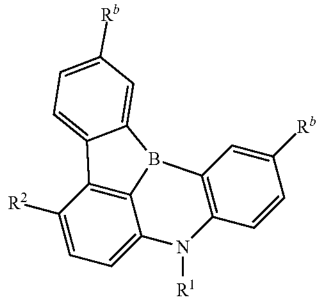

Ib-1

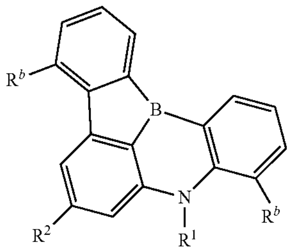

-continued

Ib-2

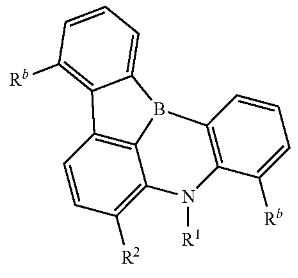

Ib-3

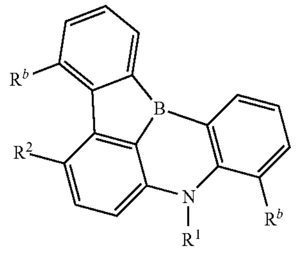

Ic-1

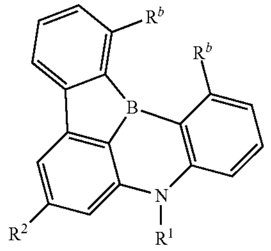

Ic-2

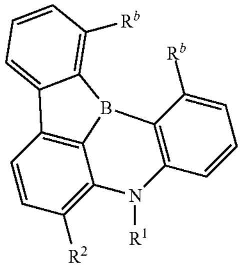

Ic-3

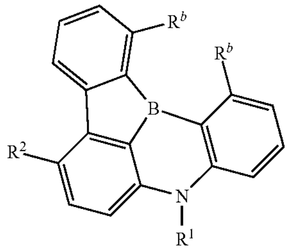

Id-1

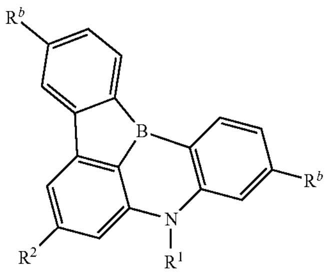

-continued

Id-2

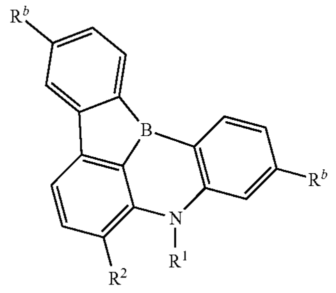

Id-3

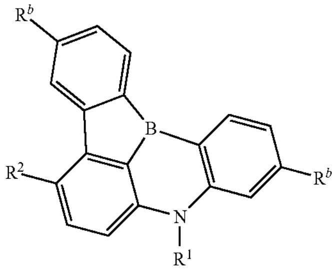

wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ia-1, Ia-2, Ia-3, Ib-1, Ib-2, Ib-3, Ic-1, Ic-2, Ic-3, Id-1, Id-2, or Id-3, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ia, Ib, Ic or Id, wherein $R^2$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Ia, Ib, Ic or Id, wherein $R^2$ is hydrogen.

In another embodiment of the invention, the organic molecule includes or consists of a structure of Formula Ia, Ib, Ic or Id, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents $R^4$.

In a further embodiment of the invention, the organic molecule includes or consists of a structure of Formula Ia, Ib, Ic or Id, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a preferred embodiment of the invention, the organic molecule includes or consists of a structure of Formula Ia, Ib, Ic or Id, wherein $R^1$ represents a pyrene group, which is optionally substituted with one or more substituents $R^4$.

In a certain embodiment of the invention, the organic molecule includes or consists of a structure of Formula Ia, Ib, Ic or Id, wherein $R^1$ represents a pyrene group, which is optionally substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a preferred embodiment of the invention, the organic molecule includes or consists of a structure of Formula Ia:

Formula Ia

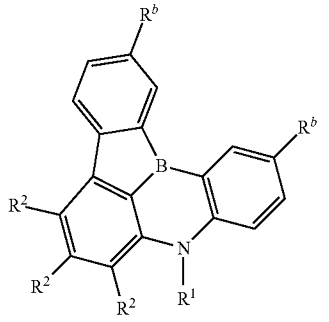

wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ia, wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph; and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ia, wherein $R^b$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Ia, wherein $R^b$ is identical at each occurrence.

In one embodiment of the invention, the organic molecule includes or consists of a structure of Formula Ia, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention, the organic molecule includes or consists of a structure of Formula Ia, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a preferred embodiment of the invention, the organic molecule includes or consists of a structure of Formula Ia-1, Ia-2, or Ia-3:

Ia-1

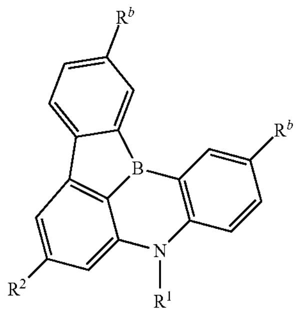

Ia-2

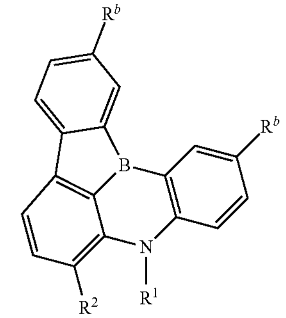

Ia-3

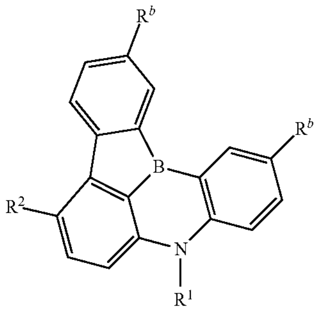

wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ia-1, Ia-2, or Ia-3, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ia, wherein $R^2$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Ia, wherein $R^2$ is Hydrogen.

In another embodiment of the invention, the organic molecule includes or consists of a structure of Formula Ia, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents $R^4$.

In a further embodiment of the invention, the organic molecule includes or consists of a structure of Formula Ia, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a preferred embodiment of the invention, the organic molecule includes or consists of a structure of Formula Ia, wherein $R^1$ represents a pyrene group, which is optionally substituted with one or more substituents $R^4$.

In a certain embodiment of the invention, the organic molecule includes or consists of a structure of Formula Ia, wherein $R^1$ represents a pyrene group, which is optionally substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In certain embodiments of the invention, the organic molecule includes or consists of a structure selected from the group consisting of Formula Ib:

Formula Ib

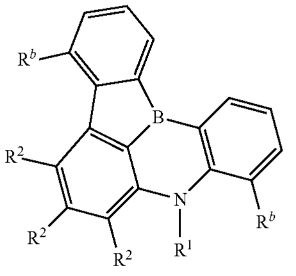

wherein $R^b$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ib, wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ib, wherein $R^b$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In certain embodiments of the invention, the organic molecule includes or consists of a structure of Formula Ib, wherein $R^b$ is identical at each occurrence.

In one embodiment of the invention, the organic molecule includes or consists of a structure of Formula Ib, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention, the organic molecule includes or consists of a structure of Formula Ib, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a preferred embodiment of the invention, the organic molecule includes or consists of a structure of Formula Ib-1, Ib-2, or Ib-3:

Ib-1

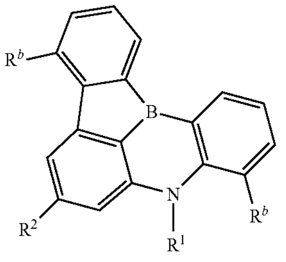

-continued

Ib-2

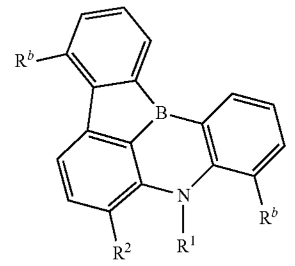

Ib-3

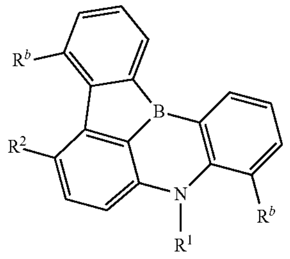

wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ib-1, Ib-2, or Ib-3, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ib, wherein $R^2$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Ib, wherein $R^2$ is Hydrogen.

In another embodiment of the invention, the organic molecule includes or consists of a structure of Formula Ib, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein the $R^1$(s) in the group may be substituted with one or more substituents $R^4$.

In a further embodiment of the invention, the organic molecule includes or consists of a structure of Formula Ib, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a preferred embodiment of the invention, the organic molecule includes or consists of a structure of Formula Ib, wherein $R^1$ represents a pyrene group, which is optionally substituted with one or more substituents $R^4$.

In a certain embodiment of the invention, the organic molecule includes or consists of a structure of Formula Ib, wherein $R^1$ represents a pyrene group, which is optionally substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In another embodiment of the invention, the organic molecule includes or consists of a structure selected from the group consisting of Formula Ic:

Formula Ic

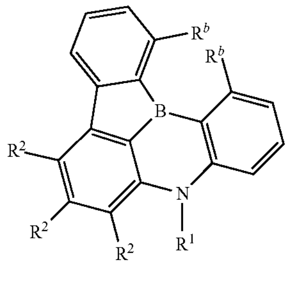

In one embodiment, the organic molecule includes or consists of a structure of Formula Ic, wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Ic, wherein $R^b$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Ic, wherein $R^b$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Ic, wherein $R^b$ is identical at each occurrence.

In one embodiment of the invention, the organic molecule includes or consists of a structure of Formula Ic, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention, the organic molecule includes or consists of a structure of Formula Ic, wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a preferred embodiment of the invention, the organic molecule includes or consists of a structure of Formula Ic-1, Ic-2, or Ic-3:

Ic-1

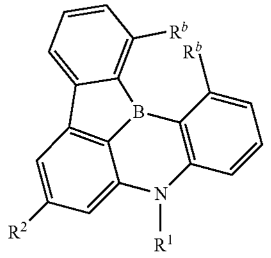

Ic-2

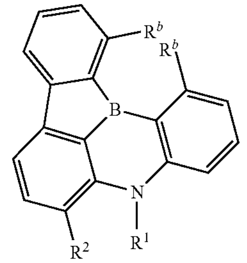

Ic-3

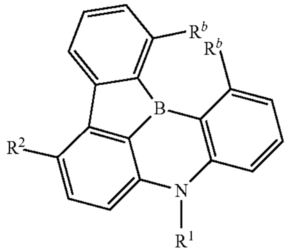

wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule includes or consists of a structure of Formula Ic-1, Ic-2, or Ic-3, wherein $R^2$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In a certain embodiment of the invention, the organic molecule includes or consists of a structure of Formula Ic, wherein $R^2$ is independently from each other selected from the group consisting of hydrogen (H), methyl (Me), i-propyl ($CH(CH_3)_2$) ($^{i}$Pr), t-butyl ($^{t}$Bu), phenyl (Ph), CN, $CF_3$, and diphenylamine ($NPh_2$).

In a certain embodiment of the invention, the organic molecule includes or consists of a structure of Formula Ic, wherein $R^2$ is Hydrogen.

In another embodiment of the invention, the organic molecule includes or consists of a structure of Formula Ic, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents $R^4$.

In a further embodiment of the invention, the organic molecule includes or consists of a structure of Formula Ic, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents independently from each other selected from the group consisting of hydrogen (H), methyl (Me), i-propyl ($CH(CHS)_2$) ($^{i}$Pr), t-butyl ($^{t}$Bu), phenyl (Ph), CN, $CF_3$, and diphenylamine ($NPh_2$).

In a preferred embodiment of the invention, the organic molecule includes or consists of a structure of Formula Ic, wherein $R^1$ represents a pyrene group, which is optionally substituted with one or more substituents $R^4$.

In a certain embodiment of the invention, the organic molecule includes or consists of a structure of Formula Ic, wherein $R^1$ represents a pyrene group, which is optionally substituted with one or more substituents independently from each other selected from the group consisting of hydrogen (H), methyl (Me), i-propyl ($CH(CH_3)_2$) ($^{i}$Pr), t-butyl ($^{t}$Bu), phenyl (Ph), CN, $CF_3$, and diphenylamine ($NPh_2$).

In a preferred embodiment of the invention, the organic molecule includes or consists of a structure selected from the group consisting of Formula Id:

Formula Id

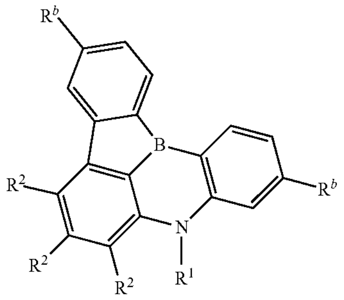

wherein $R^b$ is independently selected from the group consisting of:

hydrogen,

Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, carbazolyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

In a further embodiment of the invention, the organic molecule includes or consists of a structure of Formula Id, wherein $R^b$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, and triazinyl, which is optionally substituted with one or more substituents independently from each other selected from the group consisting of Me, $^{i}$Pr, $^{t}$Bu, CN, $CF_3$, and Ph.

In a certain embodiment of the invention, the organic molecule includes or consists of a structure of Formula Id, wherein $R^b$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Id, wherein $R^b$ is identical at each occurrence.

In one embodiment of the invention, the organic molecule includes or consists of a structure of Formula Id, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In one embodiment of the invention, the organic molecule includes or consists of a structure of Formula Id, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a preferred embodiment of the invention, the organic molecule includes or consists of a structure of Formula Id-1 Id-2, or Id-3:

Id-1

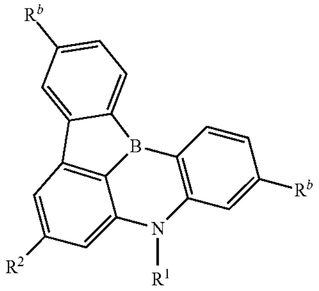

-continued

Id-2

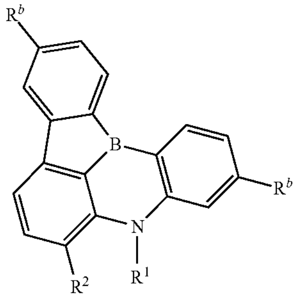

Id-3

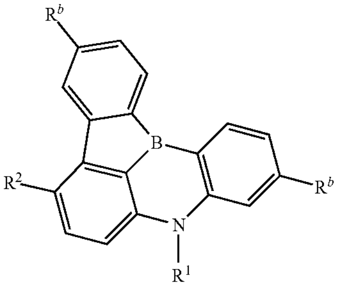

wherein $R^2$ is independently selected from the group consisting of:

hydrogen,

Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, carbazolyl, which is optionally substituted with one or more substituents independently from each other selected from the group consisting of Me, $^i$Pr, $^t$Bu, CN, $CF_3$, and Ph, triazinyl, which is optionally substituted with one or more substituents independently from each other selected from the group consisting of Me, $^i$Pr, $^t$Bu, CN, $CF_3$, and Ph, and $N(Ph)_2$.

In a further embodiment of the invention, the organic molecule includes or consists of a structure of Formula Id-1, Id-2, or Id-3, wherein $R^2$ is independently selected from the group consisting of:

hydrogen, Me, $^i$Pr, $^t$Bu, CN, $CF_3$,

Ph, which is optionally substituted with one or more substituents independently from each other selected from the group consisting of Me, $^i$Pr, $^t$Bu, CN, $CF_3$, and Ph, pyridinyl, which is optionally substituted with one or more substituents independently from each other selected from the group consisting of Me, $^i$Pr, $^t$Bu, CN, $CF_3$, and Ph, pyrimidinyl, which is optionally substituted with one or more substituents independently from each other selected from the group consisting of Me, $^i$Pr, $^t$Bu, CN, $CF_3$, and Ph, and triazinyl, which is optionally substituted with one or more substituents independently from each other selected from the group consisting of Me, $^i$Pr, $^t$Bu, CN, $CF_3$, and Ph.

In a certain embodiment of the invention, the organic molecule includes or consists of a structure of Formula Id, wherein $R^2$ is independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a certain embodiment of the invention, the organic molecule includes or consists of a structure of Formula Id, wherein $R^2$ is Hydrogen.

In another embodiment of the invention, the organic molecule includes or consists of a structure of Formula Id, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein $R^1$(s) in this group may be substituted with one or more substituents $R^4$.

In a further embodiment of the invention, the organic molecule includes or consists of a structure of Formula Id, wherein $R^1$ is selected from the group consisting of:

fluorene, naphthalene, anthracene, phenanthrene, pyrene, dihydropyrene, chrysene, perylene, fluoranthene, benzanthracene, benzophenanthrene, tetracene, pentacene, and benzopyrene, wherein these groups may be substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

In a preferred embodiment of the invention, the organic molecule includes or consists of a structure of Formula Id, wherein $R^1$ represents a pyrene group, which is optionally substituted with one or more substituents $R^4$.

In a certain embodiment of the invention, the organic molecule includes or consists of a structure of Formula Id, wherein $R^1$ represents a pyrene group, which is optionally substituted with one or more substituents independently from each other selected from the group consisting of hydrogen (H), methyl (Me), i-propyl ($CH(CH_3)_2$) ($^i$Pr), t-butyl ($^t$Bu), phenyl (Ph), CN, $CF_3$, and diphenylamine ($NPh_2$).

As used throughout the present application, the terms "aryl" and "aromatic" may be understood in the broadest sense as any mono-, bi- or polycyclic aromatic moieties. Accordingly, an aryl group contains 6 to 60 aromatic ring atoms, and a heteroaryl group contains 5 to 60 aromatic ring atoms, of which at least one is a heteroatom. Notwithstanding, throughout the application the number of aromatic ring atoms may be given as subscripted number in the definition of certain substituents. In particular, the heteroaromatic ring includes one to three heteroatoms. Again, the terms "heteroaryl" and "heteroaromatic" may be understood in the broadest sense as any mono-, bi- or polycyclic heteroaromatic moieties that include at least one heteroatom. The heteroatoms may at each occurrence be the same or different and be individually selected from the group consisting of N, O and S. Accordingly, the term "arylene" refers to a divalent substituent that bears two binding sites to other molecular structures and thereby serving as a linker structure. In case, a group in the exemplary embodiments is defined differently from the definitions given here, for example, the number of aromatic ring atoms or number of heteroatoms differs from the given definition, the definition in the exemplary embodiments is to be applied. According to the invention, a condensed (annulated) aromatic or heteroaromatic polycycle is built of two or more single aromatic or heteroaromatic cycles, which formed the polycycle via a condensation reaction.

In particular, as used throughout, the term "aryl group or heteroaryl group" includes groups which can be bound via any position of the aromatic or heteroaromatic group, derived from benzene, naphthalene, anthracene, phenanthrene, pyrene, dihydropyrene, chrysene, perylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene; pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthoimidazole, phenanthroimidazole, pyridoimidazole, pyrazinoimidazole, quinoxalinoimidazole, oxazole, benzoxazole, naphthooxazole, anthroxazol, phenanthroxazol, isoxazole, 1,2-thiazole, 1,3-thiazole, benzothiazole, pyridazine, benzopyridazine, pyrimidine, benzopyrimidine, 1,3,5-trazine, quinoxaline, pyrazine, phenazine, naphthyridine, carboline, benzocarboline, phenanthroline, 1,2,3-triazole, 1,2,4-triazole, benzotrazole, 1,2,3-oxadiazole, 1,2,4-oxadiazole, 1,2,5-oxadiazole, 1,2,3,4-tetrazine, purine, pteridine, indolizine and benzothiadiazole, or combination(s) of the above mentioned groups.

As used throughout the present application, the term "polycyclic aryl group" may be understood in the broadest sense as any aromatic moiety with at least two rings, in particular with 2, 3, 4, 5 or 6 rings, wherein the aromatic polycycle does not contain more than 6 rings. A polycyclic aryl group contains 10 to 60 ring atoms. For example, a polycyclic aryl group may be fluorene, naphthalene, anthracene, phenanthrene, pyrene, dihydropyrene, chrysene, perylene, fluoranthene, benzanthracene, benzophenanthrene, tetracene, pentacene, or benzopyrene.

As used throughout, the term "cyclic group" may be understood in the broadest sense as any mono-, bi- or polycyclic aromatic or non-aromatic moiety.

As used throughout, the term "biphenyl" as a substituent may be understood in the broadest sense as ortho-biphenyl, meta-biphenyl, or para-biphenyl, wherein ortho, meta and para are defined in regard to the binding site to another chemical moiety.

As used throughout, the term "alkyl group" may be understood in the broadest sense as any linear, branched, or cyclic alkyl substituent. In particular, the term alkyl includes the substituent(s): methyl (Me), ethyl (Et), n-propyl ($^n$Pr), i-propyl ($^i$Pr), cyclopropyl, n-butyl ($^n$Bu), i-butyl ($^i$Bu), s-butyl ($^s$Bu), t-butyl ($^t$Bu), cyclobutyl, 2-methylbutyl, n-pentyl, s-pentyl, t-pentyl, 2-pentyl, neo-pentyl, cyclopentyl, n-hexyl, s-hexyl, t-hexyl, 2-hexyl, 3-hexyl, neo-hexyl, cyclohexyl, 1-methylcyclopentyl, 2-methylpentyl, n-heptyl, 2-heptyl, 3-heptyl, 4-heptyl, cycloheptyl, 1-methylcyclohexyl, n-octyl, 2-ethylhexyl, cyclooctyl, 1-bicyclo[2,2,2]octyl, 2-bicyclo[2,2,2]-octyl, 2-(2,6-dimethyl)octyl, 3-(3,7-dimethyl)octyl, adamantyl, 2,2,2-trifluorethyl, 1,1-dimethyl-n-hex-1-yl, 1,1-dimethyl-n-hept-1-yl, 1,1-dimethyl-n-oct-1-yl, 1,1-dimethyl-n-dec-1-yl, 1,1-dimethyl-n-dodec-1-yl, 1,1-dimethyl-n-tetradec-1-yl, 1,1-dimethyl-n-hexadec-1-yl, 1,1-dimethyl-n-octadec-1-yl, 1,1-diethyl-n-hex-1-yl, 1,1-diethyl-n-hept-1-yl, 1,1-diethyl-n-oct-1-yl, 1,1-diethyl-n-dec-1-yl, 1,1-diethyl-n-dodec-1-yl, 1,1-diethyl-n-tetradec-1-yl, 1,1-diethyl-n-hexadec-1-yl, 1,1-diethyl-n-octadec-1-yl, 1-(n-propyl)-cyclohex-1-yl, 1-(n-butyl)-cyclohex-1-yl, 1-(n-hexyl)-cyclohex-1-yl, 1-(n-octyl)-cyclohex-1-yl and/or 1-(n-decyl)-cyclohex-1-yl.

As used throughout, the term "alkenyl" includes linear, branched, and/or cyclic alkenyl substituent(s). The term "alkenyl group", for example, includes the substituent(s) ethenyl, propenyl, butenyl, pentenyl, cyclopentenyl, hexenyl, cyclohexenyl, heptenyl, cycloheptenyl, octenyl, cyclooctenyl and/or cyclooctadienyl.

As used throughout, the term "alkynyl" includes linear, branched, and/or cyclic alkynyl substituent(s). The term "alkynyl group", for example, includes ethynyl, propynyl, butynyl, pentynyl, hexynyl, heptynyl or octynyl.

As used throughout, the term "alkoxy" includes linear, branched, and/or cyclic alkoxy substituent(s). The term "alkoxy group" exemplarily includes methoxy, ethoxy, n-propoxy, i-propoxy, n-butoxy, i-butoxy, s-butoxy, t-butoxy and/or 2-methylbutoxy.

As used throughout, the term "thioalkoxy" includes linear, branched, and/or cyclic thioalkoxy substituent(s), in which the O of the exemplary alkoxy groups is replaced by S.

As used throughout, the terms "halogen" and "halo" may be understood in the broadest sense as being preferably fluorine, chlorine, bromine, or iodine.

Whenever hydrogen (H) is mentioned herein, it could also be replaced by deuterium at each occurrence.

It is understood that when a molecular fragment is described as being a substituent or otherwise attached to another moiety, its name may be written as if it were a fragment (e.g. naphthyl, dibenzofuryl) or as if it were the whole molecule (e.g. naphthalene, dibenzofuran). As used herein, these different ways of designating a substituent or attached fragment are considered to be equivalent.

In one embodiment, the organic molecules according to the invention have an excited state lifetime of not more than 10 μs, of not more than 7 μs, in particular of not more than 5 μs, more preferably of not more than 2 μs or not more than 1 μs in a film of poly(methyl methacrylate) (PMMA) with 1% by weight of the organic molecule at room temperature.

If not stated otherwise, the excited state lifetime in the context of the organic molecules according to the invention is equal to and/or is determined by the delayed fluorescence lifetime or delayed fluorescence decay time.

In a further embodiment of the invention, the organic molecules according to the invention have an emission peak in the visible or nearest ultraviolet range, i.e., in the range of a wavelength of from 380 nm to 800 nm, with a full width at half maximum of less than 0.23 eV, preferably less than 0.20 eV, more preferably less than 0.19 eV, even more preferably less than 0.15 eV or even less than 0.12 eV in a film of poly(methyl methacrylate) (PMMA) with 1% by weight of organic molecule at room temperature.

Orbital and excited state energies can be determined by means of experimental methods. The energy of the highest occupied molecular orbital $E^{HOMO}$ is determined by methods known to the person skilled in the art from cyclic voltammetry measurements with an accuracy of 0.1 eV. The energy of the lowest unoccupied molecular orbital $E^{LUMO}$ is calculated as $E^{HOMO}+E^{gap}$, wherein $E^{gap}$ is determined as follows: For host compounds, the onset of the emission spectrum of a film with 10% by weight of the host in poly(methyl methacrylate) (PMMA) is used as $E^{gap}$, unless stated otherwise. For emitter molecules, $E^{gap}$ is determined as the energy at which the excitation and emission spectra of a film with 5% by weight of the emitter in PMMA cross. For the organic molecules according to the invention, EPP is determined as the energy at which the excitation and emission spectra of a film with 1% by weight of the emitter in PMMA cross.

The energy of the first excited triplet state T1 is determined from the onset of the emission spectrum at low temperature, typically at 77 K. For host compounds, where the first excited singlet state and the lowest triplet state are energetically separated by >0.4 eV, the phosphorescence is usually visible in a steady-state spectrum in 2-Me-THF. The triplet energy can thus be determined as the onset of the phosphorescence spectrum. For TADF emitter molecules, the energy of the first excited triplet state T1 is determined from the onset of the delayed emission spectrum at 77 K, if not otherwise stated, measured in a film of PMMA with 5% by weight of the emitter and in case of the organic molecules according to the invention with 1% by weight of the organic molecules according to the invention. Both for host and emitter compounds, the energy of the first excited singlet state S1 is determined from the onset of the emission spectrum, if not otherwise stated, measured in a film of PMMA with 10% by weight of the host or 5% by weight of the emitter compound and in case of the organic molecules according to the invention with 1% by weight of the organic molecules according to the invention.

The onset of an emission spectrum is determined by computing the intersection of the tangent to the emission spectrum with the x-axis. The tangent to the emission spectrum is set at the high-energy side of the emission band and at the point at half maximum of the maximum intensity of the emission spectrum.

In one embodiment, the organic molecules according to the invention have an onset of the emission spectrum, which is energetically close to the emission maximum, i.e., the energy difference between the onset of the emission spectrum and the energy of the emission maximum is below 0.14 eV, preferably below 0.12 eV, or even below 0.10 eV, while the full width at half maximum (FWHM) of the organic molecules according to the invention is less than 0.23 eV, preferably less than 0.20 eV, more preferably less than 0.19 eV, even more preferably less than 0.18 eV or even less than 0.17 eV in a film of poly(methyl methacrylate) (PMMA) with 1% by weight of organic molecule at room temperature, resulting in a CIEy coordinate below 0.20, preferably below 0.18, more preferably below 0.16 or even more preferred below 0.14.

A further aspect of the invention relates to the use of an organic molecule of the invention as a luminescent emitter or as an absorber, and/or as a host material and/or as an electron transport material, and/or as a hole injection material, and/or as a hole blocking material in an optoelectronic device.

A preferred embodiment relates to the use of an organic molecule according to the invention as a luminescent emitter in an optoelectronic device.

The optoelectronic device may be understood in the broadest sense as any device based on organic materials that is suitable for emitting light in the visible or nearest ultraviolet (UV) range, i.e., in the range of a wavelength of from 380 to 800 nm. More preferably, the optoelectronic device may be able to emit light in the visible range, i.e., of from 400 nm to 800 nm.

In the context of such use, the optoelectronic device is more particularly selected from the group consisting of:

organic light-emitting diodes (OLEDs), light-emitting electrochemical cells,

OLED sensors, especially in gas and vapor sensors that are not hermetically shielded to the surroundings, organic diodes, organic solar cells, organic transistors, organic field-effect transistors,
organic lasers, and
down-conversion elements.

In a preferred embodiment in the context of such use, the optoelectronic device is a device selected from the group consisting of an organic light emitting diode (OLED), a light emitting electrochemical cell (LEC), and a light-emitting transistor.

In the case of the use, the fraction of the organic molecule according to the invention in the emission layer in an optoelectronic device, more particularly in an OLED, is 0.1% to 99% by weight, more particularly 1% to 80% by weight. In an alternative embodiment, the proportion of the organic molecule in the emission layer is 100% by weight.

In one embodiment, the light-emitting layer EML includes not only the organic molecules according to the invention, but also a host material whose triplet (T1) and singlet (S1) energy levels are energetically higher than the triplet (T1) and singlet (S1) energy levels of the organic molecule.

A further aspect of the invention relates to a composition including or consisting of:

(a) at least one organic molecule according to the invention, in particular in the form of an emitter and/or a host, and
(b) one or more emitter and/or host materials, which differ from the organic molecule according to the invention and
(c) optionally one or more dyes and/or one or more solvents.

In one embodiment, the light-emitting layer EML includes (or essentially consists of) a composition including or consisting of:

(a) at least one organic molecule according to the invention, in particular in the form of an emitter and/or a host, and
(b) one or more emitter and/or host materials, which differ from the organic molecule according to the invention, and
(c) optionally one or more dyes and/or one or more solvents.

In a particular embodiment, the light-emitting layer EML includes (or essentially consists of) a composition including or consisting of:

(i) 0.1-10% by weight, preferably 0.5-5% by weight, in particular 1-3% by weight, of one or more organic molecules according to the invention;
(ii) 5-99% by weight, preferably 15-85% by weight, in particular 20-75% by weight, of at least one host compound H; and
(iii) 0.9-94.9% by weight, preferably 14.5-80% by weight, in particular 24-77% by weight, of at least one further host compound D with a structure differing from the structure of the molecules according to the invention; and
(iv) optionally 0-94% by weight, preferably 0-65% by weight, in particular 0-50% by weight, of a solvent; and
(v) optionally 0-30% by weight, in particular 0-20% by weight, preferably 0-5% by weight, of at least one further emitter molecule F with a structure differing from the structure of the molecules according to the invention.

Preferably, energy can be transferred from the host compound H to the one or more organic molecules according to the invention, in particular transferred from the first excited triplet state T1(H) of the host compound H to the first excited triplet state T1(E) of the one or more organic molecules according to the invention E and/or from the first excited singlet state S1(H) of the host compound H to the first excited singlet state S1(E) of the one or more organic molecules according to the invention E.

In one embodiment, the host compound H has a highest occupied molecular orbital HOMO(H) having an energy $E^{HOMO}(H)$ in the range of from −5 to −6.5 eV and the at least one further host compound D has a highest occupied molecular orbital HOMO(D) having an energy $E^{HOMO}(D)$, wherein $E^{HOMO}(H)>E^{HOMO}(D)$.

In a further embodiment, the host compound H has a lowest unoccupied molecular orbital LUMO(H) having an energy $E^{LUMO}(H)$ and the at least one further host compound D has a lowest unoccupied molecular orbital LUMO(D) having an energy $E^{LUMO}(D)$, wherein $E^{LUMO}(H)>E^{LUMO}(D)$.

In one embodiment, the host compound H has a highest occupied molecular orbital HOMO(H) having an energy $E^{HOMO}(H)$ and a lowest unoccupied molecular orbital LUMO(H) having an energy $E^{LUMO}(H)$, and the at least one further host compound D has a highest occupied molecular orbital HOMO(D) having an energy $E^{HOMO}(D)$ and a lowest unoccupied molecular orbital LUMO(D) having an energy $E^{LUMO}(D)$ the organic molecule according to the invention E has a highest occupied molecular orbital HOMO(E) having an energy $E^{HOMO}(E)$ and a lowest unoccupied molecular orbital LUMO(E) having an energy $E^{LUMO}(E)$, wherein $E^{HOMO}(H)>E^{HOMO}(D)$ and the difference between the energy level of the highest occupied molecular orbital HOMO(E) of the organic molecule according to the invention E ($E^{HOMO}(E)$) and the energy level of the highest occupied molecular orbital HOMO(H) of the host compound H ($E^{HOMO}(H)$) is between −0.5 eV and 0.5 eV, more preferably between −0.3 eV and 0.3 eV, even more preferably between −0.2 eV and 0.2 eV or even between −0.1 eV and 0.1 eV; and $E^{LUMO}(H)>E^{LUMO}(D)$ and the difference between the energy level of the lowest unoccupied molecular orbital LUMO(E) of the organic molecule according to the invention E ($E^{LUMO}(E)$) and the energy level of the lowest unoccupied molecular orbital LUMO(D) of the at least one further host compound D ($E^{LUMO}(D)$) is between −0.5 eV and 0.5 eV, more preferably between −0.3 eV and 0.3 eV, even more preferably between −0.2 eV and 0.2 eV or even between −0.1 eV and 0.1 eV.

In one embodiment of the invention the host compound D and/or the host compound H is a thermally-activated delayed fluorescence (TADF)-material. TADF materials exhibit a $\Delta E_{ST}$ value, which corresponds to the energy difference between the first excited singlet state (S1) and the first excited triplet state (T1), of less than 2500 $cm^{-1}$. Preferably the TADF material exhibits a $\Delta E_{ST}$ value of less than 3000 $cm^{-1}$, more preferably less than 1500 $cm^{-1}$, even more preferably less than 1000 $cm^{-1}$ or even less than 500 $cm^{-1}$.

In one embodiment, the host compound D is a TADF material and the host compound H exhibits a $\Delta E_{ST}$ value of more than 2500 $cm^{-1}$. In a particular embodiment, the host compound D is a TADF material and the host compound H is selected from group consisting of CBP, mCP, mCBP, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole.

In one embodiment, the host compound H is a TADF material and the host compound D exhibits a $\Delta E_{ST}$ value of more than 2500 $cm^{-1}$. In a particular embodiment, the host compound H is a TADF material and the host compound D is selected from group consisting of T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine).

In a further aspect, the invention relates to an optoelectronic device including an organic molecule or a composition of the type described here, more particularly in the form of a device selected from the group consisting of organic light-emitting diode (OLED), light-emitting electrochemical cell, OLED sensor, more particularly gas and vapour sensors not hermetically externally shielded, organic diode, organic solar cell, organic transistor, organic field-effect transistor, organic laser and down-conversion element.

In a preferred embodiment, the optoelectronic device is a device selected from the group consisting of an organic light emitting diode (OLED), a light emitting electrochemical cell (LEC), and a light-emitting transistor.

In one embodiment of the optoelectronic device of the invention, the organic molecule according to the invention E is used as emission material in a light-emitting layer EML.

In one embodiment of the optoelectronic device of the invention, the light-emitting layer EML consists of the composition according to the invention described here.

When the optoelectronic device is an OLED, it may, for example, have the following layer structure:

1. substrate
2. anode layer, A
3. hole injection layer, HIL
4. hole transport layer, HTL
5. electron blocking layer, EBL
6. emitting layer, EML
7. hole blocking layer, HBL
8. electron transport layer, ETL
9. electron injection layer, EIL
10. cathode layer, C wherein the OLED only optionally includes each layer selected from the group of HIL, HTL, EBL, HBL, ETL, and EIL, and the different layers may be merged together into, e.g., one or more layers, and the OLED may include more than one layer of each layer type defined above.

Furthermore, the optoelectronic device may, in one embodiment, include one or more protective layers protecting the device from damaging exposure to harmful species in the environment including, for example, moisture, vapor and/or gases.

In one embodiment of the invention, the optoelectronic device is an OLED, with the following inverted layer structure:

1. substrate
2. cathode layer, C
3. electron injection layer, EIL
4. electron transport layer, ETL
5. hole blocking layer, HBL
6. emitting layer, EML
7. electron blocking layer, EBL
8. hole transport layer, HTL
9. hole injection layer, HIL
10. anode layer, A wherein the OLED only optionally includes each layer selected from the group of HIL, HTL, EBL, HBL, ETL, and EIL only optionally, different layers may be merged together into, e.g., one or more layers, and the OLED may include more than one layer of each layer types defined above.

In one embodiment of the invention, the optoelectronic device is an OLED, which may have a stacked architecture. In this architecture, contrary to the typical arrangement in which the OLEDs are placed side by side, the individual units are stacked on top of each other. Blended light may be generated with OLEDs exhibiting a stacked architecture, in particular white light may be generated by stacking blue, green and red OLEDs. Furthermore, the OLED exhibiting a stacked architecture may include a charge generation layer (CGL), which is typically located between two OLED subunits and typically consists of an n-doped layer and/or a p-doped layer with the n-doped layer of one CGL being typically located closer to the anode layer.

In one embodiment of the invention, the optoelectronic device is an OLED, which includes two or more emission layers between anode and cathode. In particular, this so-called tandem OLED includes three emission layers, wherein one emission layer emits red light, one emission layer emits green light and one emission layer emits blue light, and optionally may include further layers such as charge generation layers, blocking or transporting layers between the individual emission layers. In a further embodiment, the emission layers are adjacently stacked. In a further embodiment, the tandem OLED includes a charge generation layer between each two emission layers. In addition, adjacent emission layers or emission layers separated by a charge generation layer may be merged.

The substrate may be formed by any material or composition of materials. Most frequently, glass slides are used as substrates. Alternatively, thin metal layers (e.g., copper, gold, silver or aluminum films) or plastic films or slides may be used. This may allow for a higher degree of flexibility. The anode layer A is mostly composed of materials allowing to obtain an (essentially) transparent film. As at least one of both electrodes should be (essentially) transparent in order to allow light emission from the OLED, either the anode layer A or the cathode layer C is transparent. Preferably, the anode layer A includes a large content or even consists of transparent conductive oxides (TCOs). Such anode layer A may, for example, include indium tin oxide, aluminum zinc oxide, fluorine doped tin oxide, indium zinc oxide, PbO, SnO, zirconium oxide, molybdenum oxide, vanadium oxide, tungsten oxide, graphite, doped Si, doped Ge, doped GaAs, doped polyaniline, doped polypyrrol and/or doped polythiophene.

The anode layer A (essentially) may consist of indium tin oxide (ITO) (e.g., $(InO_3)_{0.9}(SnO_2)_{0.1}$). The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may include poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL). The HIL may, for example, include PEDOT:PSS (poly-3,4-ethylendioxy thiophene: polystyrene sulfonate), PEDOT (poly-3,4-ethylendioxy thiophene), mMTDATA (4,4',4"-tris[phenyl(m-tolyl)amino]triphenylamine), Spiro-TAD (2,2',7,7'-tetrakis(n,n-diphenylamino)-9,9'-spirobifluorene), DNTPD (N1,N1'-(biphenyl-4,4'-diyl)bis(N1-phenyl-N4,N4-di-m-tolylbenzene-1,4-diamine), NPB (N,N'-nis-(1-naphthalenyl)-N,N'-bis-phenyl-(1,1'-biphenyl)-4,4'-diamine), NPNPB (N,N'-diphenyl-N,N'-di-[4-(N,N-diphenylamino)phenyl]benzidine), MeO-TPD (N,N,N',N'-tetrakis(4-methoxyphenyl)benzidine), HAT-CN (1,4,5,8,9,11-hexaazatriphenylene-hexacarbonitrile) and/or Spiro-NPD (N,N'-diphenyl-N,N'-bis-(1-naphthyl)-9,9'-spirobifluorene-2,7-diamine).

Adjacent to the anode layer A or hole injection layer (HIL), a hole transport layer (HTL) is typically located. Herein, any hole transport compound may be used. For example, electron-rich heteroaromatic compounds such as triarylamines and/or carbazoles may be used as hole transport compound. The HTL may decrease the energy barrier between the anode layer A and the light-emitting layer EML. The hole transport layer (HTL) may also be an electron blocking layer (EBL). Preferably, hole transport compounds bear comparably high energy levels of their triplet states T1. For example, the hole transport layer (HTL) may include a star-shaped heterocycle such as tris(4-carbazoyl-9-ylphenyl) amine (TCTA), poly-TPD (poly(4-butylphenyl-diphenyl-amine)), [alpha]-NPD (poly(4-butylphenyl-diphenyl-amine)), TAPC (4,4'-cyclohexyliden-bis[N,N-bis(4-methylphenyl)benzenamine]), 2-TNATA (4,4',4''-tris[2-naphthyl(phenyl)amino]triphenylamine), Spiro-TAD, DNTPD, NPB, NPNPB, MeO-TPD, HAT-CN and/or Tris-Pcz (9,9'-diphenyl-6-(9-phenyl-9H-carbazol-3-yl)-9H,9'H-3,3'-bicarbazole). In addition, the HTL may include a p-doped layer, which may be composed of an inorganic or organic dopant in an organic hole-transporting matrix. Transition metal oxides such as vanadium oxide, molybdenum oxide or tungsten oxide may, for example, be used as inorganic dopant. Tetrafluorotetracyanoquinodimethane ($F_4$-TCNQ), copper-pentafluorobenzoate (Cu(I)pFBz) or transition metal complexes may, for example, be used as organic dopant.

The EBL may, for example, include mCP (1,3-bis(carbazol-9-yl)benzene), TCTA, 2-TNATA, mCBP (3,3-di(9H-carbazol-9-yl)biphenyl), tris-Pcz, CzSi (9-(4-tert-butylphenyl)-3,6-bis(triphenylsilyl)-9H-carbazole), and/or DCB (N,N'-dicarbazolyl-1,4-dimethylbenzene).

Adjacent to the hole transport layer (HTL), the light-emitting layer EML is typically located. The light-emitting layer EML includes at least one light emitting molecule. Particularly, the EML includes at least one light emitting molecule according to the invention E. In one embodiment, the light-emitting layer EML includes only the organic molecules according to the invention. Typically, the EML additionally includes one or more host materials H. For example, the host material H is selected from CBP (4,4'-bis-(N-carbazolyl)-biphenyl), mCP, mCBP Sif87 (dibenzo[b,d]thiophen-2-yltriphenylsilane), CzSi, Sif88 (dibenzo[b,d]thiophen-2-yl)diphenylsilane), DPEPO (bis[2-(diphenylphosphino)phenyl]ether oxide), 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole, 9-[3,5-bis(2-dibenzothiophenyl)phenyl]-9H-carbazole, T2T (2,4,6-tris(biphenyl-3-yl)-1,3,5-triazine), T3T (2,4,6-tris(triphenyl-3-yl)-1,3,5-triazine) and/or TST (2,4,6-tris(9,9'-spirobifluorene-2-yl)-1,3,5-triazine). The host material H typically should be selected to exhibit first triplet (T1) and first singlet (S1) energy levels, which are energetically higher than the first triplet (T1) and first singlet (S1) energy levels of the organic molecule.

Alternatively, the EML additionally includes one or more host materials H, wherein the host is a triplet-triplet annihilation (TTA) material. A TTA material may convert energy from the first excited triplet states T1 to the first excited singlet state S1 by triplet-triplet annihilation. A TTA material should be selected so that twice the energy of the lowermost excited triplet state energy level T1 of the TTA material is larger than the energy of the lowermost excited singlet state energy level of the light emitting molecule according to the invention, i.e., 2T1 (TTA material)>S1 (light emitting molecule according to the invention).

In one embodiment of the invention, the EML includes a so-called mixed-host system with at least one hole-dominant host and one electron-dominant host. In a particular embodiment, the EML includes exactly one light emitting organic molecule according to the invention and a mixed-host system including T2T as the electron-dominant host and a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole as the hole-dominant host. In a further embodiment the EML includes 50-80% by weight, preferably 60-75% by weight of a host selected from CBP, mCP, mCBP, 9-[3-(dibenzofuran-2-yl)phenyl]-9H-carbazole, 9-[3-(dibenzofuran-2-yl)phenyl]-9H-carbazole, 9-[3-(dibenzothiophen-2-yl)phenyl]-9H-carbazole, 9-[3,5-bis(2-dibenzofuranyl)phenyl]-9H-carbazole and 9-[3,5-bis(2-dibenzothiophenyl)phenyl]-9H-carbazole; 10-45% by weight, preferably 15-30% by weight of T2T and 5-40% by weight, preferably 10-30% by weight of light emitting molecule according to the invention.

Adjacent to the light-emitting layer EML, an electron transport layer (ETL) may be located. Herein, any electron transporter may be used. Exemplarily, one or more electron-poor compounds such as, e.g., benzimidazoles, pyridines, triazoles, oxadiazoles (e.g., 1,3,4-oxadiazole), phosphinoxides and sulfone, may be used. An electron transporter may also be a star-shaped heterocycle such as 1,3,5-tr(1-phenyl-1H-benzo[d]imidazol-2-yl)phenyl (TPBi). The ETL may include NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), BPyTP2 (2,7-di(2,2'-bipyridin-5-yl)triphenyle), Sif87 (dibenzo[b,d]thiophen-2-yltriphenylsilane), Sif88 (dibenzo[b,d]thiophen-2-yl)diphenylsilane), BmPyPhB (1,3-bis[3,5-di(pyridin-3-yl)phenyl]benzene) and/or BTB (4,4'-bis-[2-(4,6-diphenyl-1,3,5-triazinyl)]-1,1'-biphenyl). Optionally, the ETL may be doped with materials such as Liq. The electron transport layer (ETL) may also block holes or a hole blocking layer (HBL) is introduced.

The HBL may, for example, include BCP (2,9-dimethyl-4,7-diphenyl-1,10-phenanthroline=Bathocuproine), BAlq (bis(8-hydroxy-2-methylquinoline)-(4-phenylphenoxy)aluminum), NBphen (2,9-bis(naphthalen-2-yl)-4,7-diphenyl-1,10-phenanthroline), $Alq_3$ (Aluminum-tris(8-hydroxyquinoline)), TSPO1 (diphenyl-4-triphenylsilylphenyl-phosphinoxide), T2T (2,4,6-tris(biphenyl-3-yl)-1,3,5-triazine), T3T (2,4,6-tris(triphenyl-3-yl)-1,3,5-triazine), TST (2,4,6-tris(9,9'-spirobifluorene-2-yl)-1,3,5-triazine), and/or TCB/TCP (1,3,5-tris(N-carbazolyl)benzol/1,3,5-tris(carbazol)-9-yl)benzene).

Adjacent to the electron transport layer (ETL), a cathode layer C may be located. The cathode layer C may, for example, include or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer C may also consist of (essentially) intransparent metals such as Mg, Ca or Al. Alternatively or additionally, the cathode layer C may also include graphite and or carbon nanotubes (CNTs). Alternatively, the cathode layer C may also consist of nanoscalic silver wires.

An OLED may further, optionally, include a protection layer between the electron transport layer (ETL) and the cathode layer C (which may be designated as electron injection layer (EIL)). This layer may include lithium fluoride, cesium fluoride, silver, Liq (8-hydroxyquinolinolatolithium), $Li_2O$, $BaF_2$, MgO and/or NaF.

Optionally, the electron transport layer (ETL) and/or a hole blocking layer (HBL) may also include one or more host compounds H.

In order to modify the emission spectrum and/or the absorption spectrum of the light-emitting layer EML further, the light-emitting layer EML may further include one or more further emitter molecules F. Such an emitter molecule F may be any emitter molecule known in the art. Preferably such an emitter molecule F is a molecule with a structure differing from the structure of the molecules according to the invention E. The emitter molecule F may optionally be a TADF emitter. Alternatively, the emitter molecule F may optionally be a fluorescent and/or phosphorescent emitter molecule which is able to shift the emission spectrum and/or the absorption spectrum of the light-emitting layer EML. Exemplarily, the triplet and/or singlet excitons may be transferred from the organic emitter molecule according to the invention to the emitter molecule F before relaxing to the ground state S0 by emitting light typically red-shifted in comparison to the light emitted by an organic molecule. Optionally, the emitter molecule F may also provoke two-photon effects (i.e., the absorption of two photons of half the energy of the absorption maximum).

Optionally, an optoelectronic device (e.g., an OLED) may, for example, be an essentially white optoelectronic device. For example, such white optoelectronic device may include at least one (deep) blue emitter molecule and one or more emitter molecules emitting green and/or red light. Then, there may also optionally be energy transmittance between two or more molecules as described above.

As used herein, if not defined more specifically in the particular context, the designation of the colors of emitted and/or absorbed light is as follows:

violet: wavelength range of >380-420 nm;
deep blue: wavelength range of >420-480 nm;
sky blue: wavelength range of >480-500 nm;
green: wavelength range of >500-560 nm;
yellow: wavelength range of >560-580 nm;
orange: wavelength range of >580-620 nm;
red: wavelength range of >620-800 nm.

With respect to emitter molecules, such colors refer to the emission maximum. Therefore, for example, a deep blue emitter has an emission maximum in the range of from >420 to 480 nm, a sky blue emitter has an emission maximum in the range of from >480 to 500 nm, a green emitter has an emission maximum in a range of from >500 to 560 nm, and a red emitter has an emission maximum in a range of from >620 to 800 nm.

A deep blue emitter may preferably have an emission maximum of below 480 nm, more preferably below 470 nm, even more preferably below 465 nm or even below 460 nm. It will typically be above 420 nm, preferably above 430 nm, more preferably above 440 nm or even above 450 nm.

Accordingly, a further aspect of the present invention relates to an OLED, which exhibits an external quantum efficiency at 1000 cd/$m^2$ of more than 8%, more preferably of more than 10%, more preferably of more than 13%, even more preferably of more than 15% or even more than 20% and/or exhibits an emission maximum between 420 nm and 500 nm, preferably between 430 nm and 490 nm, more preferably between 440 nm and 480 nm, even more preferably between 450 nm and 470 nm and/or exhibits a LT80 value at 500 cd/$m^2$ of more than 100 h, preferably more than 200 h, more preferably more than 400 h, even more preferably more than 750 h or even more than 1000 h. Accordingly, a further aspect of the present invention relates to an OLED, whose emission exhibits a CIEy color coordinate of less than 0.45, preferably less than 0.30, more preferably less than 0.20 or even more preferably less than 0.15 or even less than 0.10.

A further aspect of the present invention relates to an OLED, which emits light at a distinct color point. According to the present invention, the OLED emits light with a narrow emission band (small full width at half maximum (FWHM)). In one aspect, the OLED according to the invention emits light with a FWHM of the main emission peak of less than 0.30 eV, preferably less than 0.25 eV, more preferably less than 0.18 eV, even more preferably less than 0.15 eV or even less than 0.12 eV.

A further aspect of the present invention relates to an OLED, which emits light with CIEx and CIEy color coordinates close to the CIEx (=0.131) and CIEy (=0.046) color coordinates of the primary color blue (CIEx=0.131 and CIEy=0.046) as defined by ITU-R Recommendation BT.2020 (Rec. 2020) and thus is suited for the use in Ultra High Definition (UHD) displays, e.g. UHD-TVs. Accordingly, a further aspect of the present invention relates to an OLED, whose emission exhibits a CIEx color coordinate of between 0.02 and 0.30, preferably between 0.03 and 0.25, more preferably between 0.05 and 0.20 or even more preferably between 0.08 and 0.18 or even between 0.10 and 0.15 and/or a CIEy color coordinate of between 0.00 and 0.45, preferably between 0.01 and 0.30, more preferably between 0.02 and 0.20 or even more preferably between 0.03 and 0.15 or even between 0.04 and 0.10.

In a further aspect, the invention relates to a method for producing an optoelectronic component. In this case an organic molecule of the invention is used.

The optoelectronic device, in particular the OLED according to the present invention can be fabricated by any means of vapor deposition and/or liquid processing. Accordingly, at least one layer is prepared by means of a sublimation process,
prepared by means of an organic vapor phase deposition process,
prepared by means of a carrier gas sublimation process, and/or
solution processed or printed.

The methods used to fabricate the optoelectronic device, in particular the OLED according to the present invention are known in the art. The different layers are individually and successively deposited on a suitable substrate by means of subsequent deposition processes. The individual layers may be deposited using the same or differing deposition methods.

Vapor deposition processes, for example, include thermal (co)evaporation, chemical vapor deposition and physical vapor deposition. For active matrix OLED display, an AMOLED backplane is used as substrate. The individual layer may be processed from solutions or dispersions employing adequate solvents. Solution deposition process, for example, include spin coating, dip coating and jet printing. Liquid processing may optionally be carried out in an inert atmosphere (e.g., in a nitrogen atmosphere) and the solvent may be completely or partially removed by means known in the state of the art.

EXAMPLES

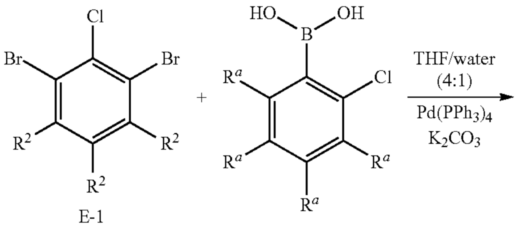

E-1 E-2

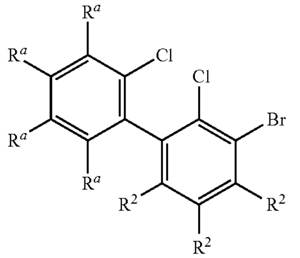

P-1

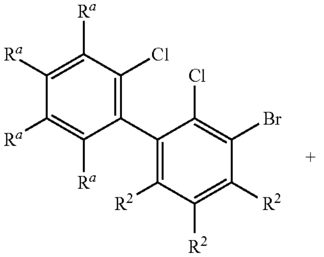

P-1

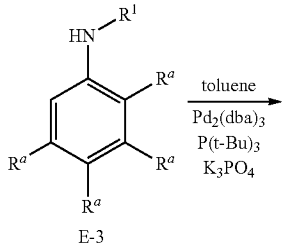

E-3

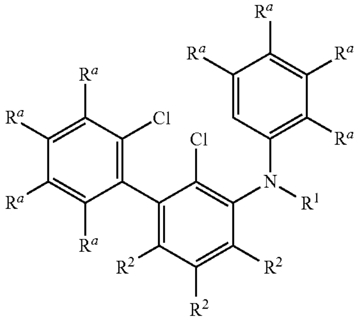

P-2

-continued

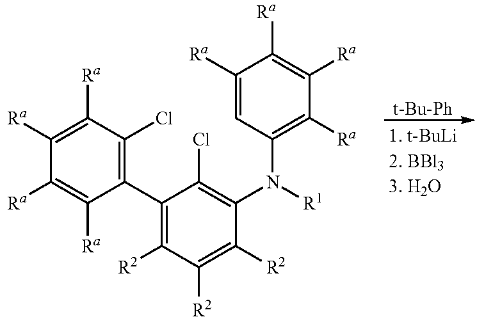

P-2

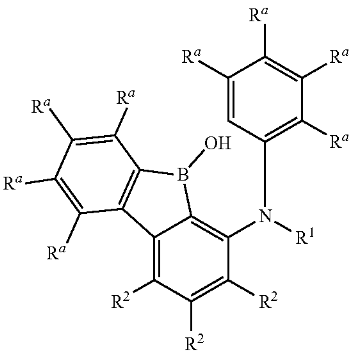

P-3

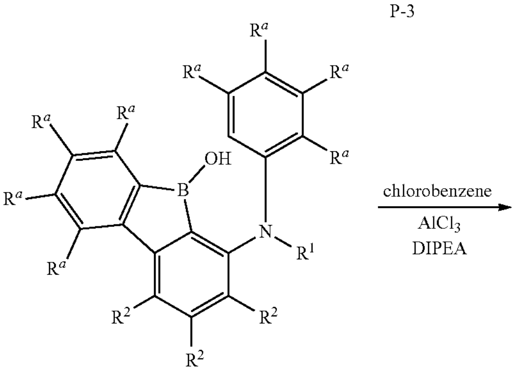

P-3

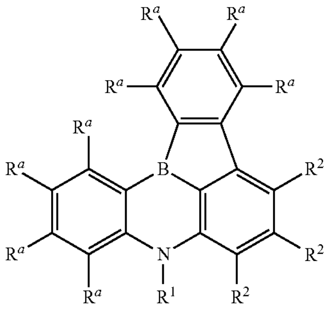

P-4

General Procedure for Synthesis:

AAV1: 1,3-dibromo-2-chlorobenzene derivative E-1 (1.00 equivalents), 2-chlorophenylboronic acid derivative E-2 (1.00 equivalents), tetrakis(triphenylphosphine)palladium(0) (0.05 equivalents) and potassium carbonate (1.50 equivalents) were stirred under nitrogen atmosphere in a THF/water (4:1) mixture at 80° C. for 12 h. After cooling down to room temperature (rt), the reaction mixture was extracted between ethyl acetate and water. The combined organic layers were dried over $MgSO_4$, filtered and concentrated under reduced pressure. The crude material was purified by column chromatography or recrystallization. The product P-1 was obtained as a solid.

AAV2: P-1 (1.00 equivalents), secondary amine E-3 (1.10 equivalents), tris(dibenzylideneacetone)dipalladium(0) (CAS: 51364-51-3, 0.01 equivalents), tri-tert-butyl phosphine (CAS: 13716-12-6, 0.04 equivalents) and sodium tert-butoxide (CAS: 865-48-5, 1.70 equivalents) were stirred under nitrogen atmosphere in dry toluene at 110° C. for 12 h. After cooling down to room temperature (rt), the phases were separated and the combined organic layers were dried over $MgSO_4$, filtered and concentrated under reduced pressure. The crude material was purified by column chromatography or recrystallization. The product P-2 was obtained as a solid.

AAV3: P-2 (1.00 equivalents) was placed in a round bottom flask under nitrogen and dissolved in dry tert-butylbenzene. At rt, tert-butyllithium (1.6 M in hexane, CAS: 594-19-4, 4.20 equivalents) was injected. Subsequently, the mixture was heated to 50° C. for 1 h. After cooling to rt, the mixture was cooled to 0° C., followed by the addition of boron tribromide (1 M in hexane, CAS: 10294-33-4, 1.2 equivalents). The mixture was stirred at rt for 30 min, followed by heating at 80° C. for 1 h. After cooling down to rt, the reaction was quenched with water. The phases were separated, the combined organic layers were dried over $MgSO_4$ and concentrated under reduced pressure. The crude material was purified by recrystallization or column chromatography. The desired product P-3 was obtained as a solid.

AAV4: Under nitrogen, in a three-necked flask, P-3 was dissolved in dry chlorobenzene. Aluminum trichloride (CAS: 7446-70-0, 5.0 equivalents) and N,N-diisopropylethylamine (CAS: 7087-68-5, 5.0 equivalents) were added and the mixture stirred at 120° C. for 2 h. After cooling down to 0° C., the reaction was quenched by adding water. The phases were separated and the combined organic layers were washed with water, dried over $MgSO_4$, filtered and concentrated under reduced pressure. The crude material was purified by recrystallization or column chromatography. The target material P-4 was obtained as a solid.

Cyclic Voltammetry

Cyclic voltammograms were measured from solutions having concentration of $10^{-3}$ mol/L of the organic molecules in dichloromethane or a suitable solvent and a suitable supporting electrolyte (e.g. 0.1 mol/L of tetrabutylammonium hexafluorophosphate). The measurements were conducted at room temperature under nitrogen atmosphere with a three-electrode assembly (Working and counter electrodes: Pt wire, reference electrode: Pt wire) and calibrated using $FeCp_2/FeCp_2^+$ as internal standard. The HOMO data was corrected using ferrocene as internal standard against a saturated calomel electrode (SCE).

Density Functional Theory Calculation

Molecular structures were optimized employing the BP86 functional and the resolution of identity approach (RI). Excitation energies were calculated using the (BP86) optimized structures employing Time-Dependent DFT (TD-DFT) methods. Orbital and excited state energies were calculated with the B3LYP functional. Def2-SVP basis sets (and an m4-grid for numerical integration were used. The Turbomole program package was used for all calculations.

Photophysical Measurements

Sample Preparation of host material and organic TADF emitters:

Stock solution 1:10 mg of sample (organic TADF material or host material) was dissolved in 1 ml of solvent.

Stock solution 2: 10 mg of PMMA was dissolved in 1 ml solvent.

The solvent is typically selected from toluene, chlorobenzene, dichloromethane and chloroform.

An Eppendorf pipette was used to add 1 ml of stock solution 1 to 9 ml of stock solution 2 to achieve a 10% by weight of sample in PMMA.

Alternatively, the photophysical properties of the host material can be characterized in neat films of the host material.

Sample Preparation of organic molecules according to the invention:

Stock solution 1: 10 mg of sample was dissolved in 1 ml of solvent.

Stock solution 1a: 9 ml of solvent was added to 1 ml of stock solution 1.

Stock solution 2: 10 mg of PMMA was dissolved in 1 ml solvent.

The solvent is typically selected from the group consisting of toluene, chlorobenzene, dichloromethane and chloroform.

An Eppendorf pipette was used to add 1 ml of stock solution 1 to 9.9 ml of stock solution 2 to achieve a 1% by weight of sample in PMMA.

Sample Pretreatment: Spin-Coating

Apparatus: Spin150, SPS euro.

The sample concentration was 10 mg/ml, dissolved in a suitable solvent.

Program: 1) 3 s at 400 U/min; 2) 20 s at 1000 U/min at 1000 Upm/s; 3) 10 s at 4000 U/min at 1000 Upm/s. After coating, the films were dried at 70° C. for 1 min.

Photoluminescence Spectroscopy and Time-Correlated Single-Photon Counting (TCSPC)

Steady-state emission spectroscopy was measured by a Horiba Scientific, Modell FluoroMax-4 equipped with a 150 W Xenon-Arc lamp, excitation- and emissions monochromators and a Hamamatsu R928 photomultiplier and a time-correlated single-photon counting option. Emissions and excitation spectra were corrected using standard correction fits.

Excited state lifetimes were determined employing the same system using the TCSPC method with FM-2013 equipment and a Horiba Yvon TCSPC hub.

Excitation Sources:

NanoLED 370 (wavelength: 371 nm, puls duration: 1.1 ns)

NanoLED 290 (wavelength: 294 nm, puls duration: <1 ns)

SpectraLED 310 (wavelength: 314 nm)

SpectraLED 355 (wavelength: 355 nm).

Data analysis (exponential fit) was done using the software suite DataStation and DAS6 analysis software. The fit was specified using the chi-squared-test:

$$c^2 = \sum_{k=1}^{i} \frac{(e_i - o_i)^2}{e_i}$$

wherein $e_i$ denotes the value, which was predicted by the fit and $o_i$ denotes the measured value.

Time-Resolved PL Spectroscopy in the µs Range

Time-resolved transients were also measured on an FS5 fluorescence spectrometer from Edinburgh Instruments. Compared to measurements on the comparable HORIBA system, the FS5 enables an increased luminous efficacy and thus an improved ratio between sample emission and background noise, which particularly improves measurements of delayed fluorescent emitters. The sample to be examined was excited using a broadband xenon lamp (150 W xenon arc lamp). The FS5 uses Czerny-Turner monochromators for both selective excitation and emission wavelengths. The photoluminescence of the sample was detected via an R928P photomultiplier tube, the photocathode of the detector allowing the time-resolved measurement in the spectral range from 200 nm to 870 nm.

The temperature-stabilized detector unit also guarantees a dark count rate of less than 300 events per second. To determine the decay time of the PL transient, the μs range was then approximated using three exponential functions. An average lifetime $\tau_{DF}$ for the delayed fluorescence of $$\tau_{DF} = \sum_{i=1}^{3} \frac{A_i \tau_i}{A_i},$$

with the respective monoexponential decay times $\tau_i$ and associated amplitudes $A_i$.

The excited state lifetime can be determined by a tail fit or mono-exponential tail fit.

Photoluminescence Quantum Yield (PLQY) Measurements

For photoluminescence quantum yield measurements an Absolute PL Quantum Yield Measurement C9920-03G system (Hamamatsu Photonics) was used. Quantum yields and CIE coordinates were determined using the software U6039-05 version 3.6.0.

Emission maxima were given in nm, quantum yields ϕ in % and CIE coordinates as x,y values.

PLOY was determined using the following protocol:

Quality assurance: Anthracene in ethanol (known concentration) was used as reference Excitation wavelength: the absorption maximum of the organic molecule was determined and the molecule was excited using this wavelength Measurement Quantum yields were measured, for sample, of solutions or films under nitrogen atmosphere. The yield was calculated using the equation:

$$\Phi_{PL} = \frac{n_{photon}, \text{emited}}{n_{photon}, \text{absorbed}} = \frac{\int \frac{\lambda}{hc}\left[Int_{emitted}^{sample}(\lambda) - Int_{absorbed}^{sample}(\lambda)\right]d\lambda}{\int \frac{\lambda}{hc}\left[Int_{emitted}^{reference}(\lambda) - Int_{absorbed}^{reference}(\lambda)\right]d\lambda}$$

wherein $n_{photon}$ denotes the photon count and Int. denotes the intensity.

Production and Characterization of Optoelectronic Devices

Optoelectronic devices, in particular OLED devices, including organic molecules according to the invention can be produced via vacuum-deposition methods. If a layer contains more than one compound, the weight-percentage of one or more compounds is given in %. The total weight-percentage values amount to 100%, thus if a value is not given, the fraction of this compound equals to the difference between the given values and 100%.

The not fully optimized OLEDs were characterized using standard methods and measuring electroluminescence spectra, the external quantum efficiency (in %) in dependency on the intensity, calculated using the light detected by the photodiode, and the current. The OLED device lifetime was extracted from the change of the luminance during operation at constant current density. The LT50 value corresponds to the time, where the measured luminance decreased to 50% of the initial luminance, analogously LT80 corresponds to the time point, at which the measured luminance decreased to 80% of the initial luminance, LT 95 to the time point, at which the measured luminance decreased to 95% of the initial luminance etc.

Accelerated lifetime measurements were performed (e.g. applying increased current densities). For example, LT80 values at 500 cd/m$^2$ were determined using the following equation:

$$LT80\left(500\ \frac{\text{cd}}{\text{m}^2}\right) = LT80(L_0)\left(\frac{L_0}{500\ \frac{\text{cd}}{\text{m}^2}}\right)^{1.6}$$

wherein $L_0$ denotes the initial luminance at the applied current density.

The values correspond to the average of several pixels (typically two to eight), the standard deviation between these pixels was given.

HPLC-MS

HPLC-MS analysis was performed on an HPLC by Agilent (1100 series) with MS-detector (Thermo LTQ XL).

For example, a typical HPLC method is as follows: a reverse phase column 4.6 mm×150 mm, particle size 3.5 μm from Agilent (ZORBAX Eclipse Plus 95Å C18, 4.6×150 mm, 3.5 μm HPLC column) was used in the HPLC. The HPLC-MS measurements were performed at room temperature (rt) with the following gradients

| Flow rate [ml/min] | Time [min] | A [%] | B [%] | C [%] |
|---|---|---|---|---|
| 2.5 | 0 | 40 | 50 | 10 |
| 2.5 | 5 | 40 | 50 | 10 |
| 2.5 | 25 | 10 | 20 | 70 |
| 2.5 | 35 | 10 | 20 | 70 |
| 2.5 | 35.01 | 40 | 50 | 10 |
| 2.5 | 40.01 | 40 | 50 | 10 |
| 2.5 | 41.01 | 40 | 50 | 10 |

using the following solvent mixtures:

| | | |
|---|---|---|
| Solvent A: | H2O (90%) | MeCN (10%) |
| Solvent B: | H2O (10%) | MeCN (90%) |
| Solvent C: | THF (50%) | MeCN (50%) |

An injection volume of 5 μL from a solution with a concentration of 0.5 mg/mL of the analyte was taken for the measurements.

Ionization of the probe was performed using an atmospheric pressure chemical ionization (APCI) source either in positive (APCI +) or negative (APCI −) ionization mode.

Additional Examples of the Organic Molecules of the Invention
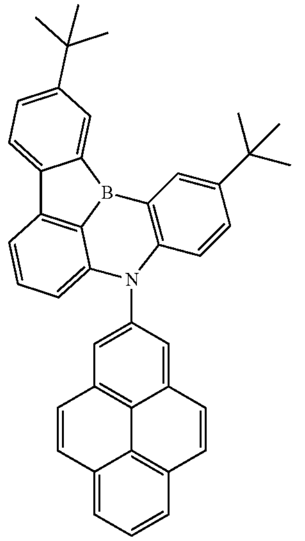
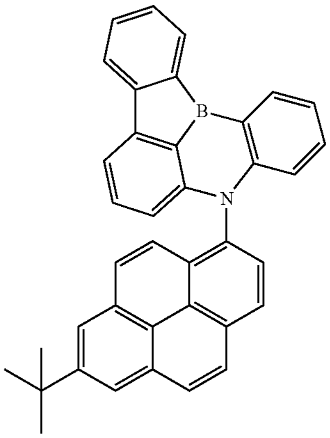
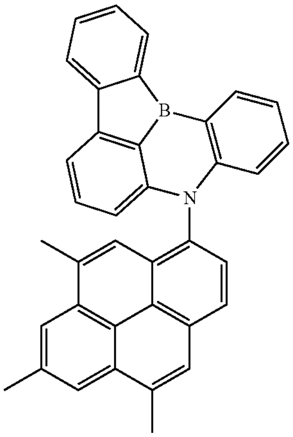
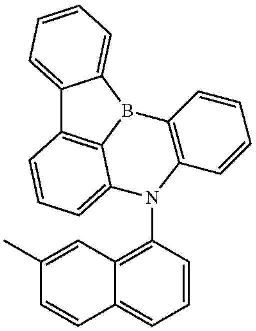
-continued
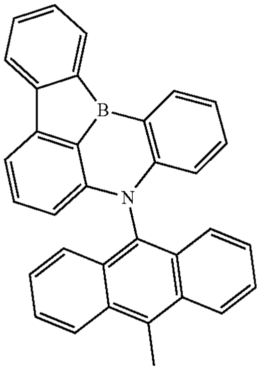
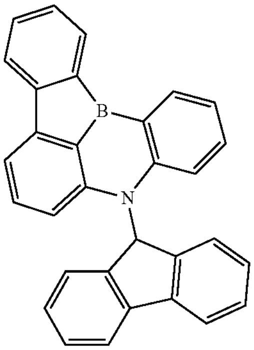
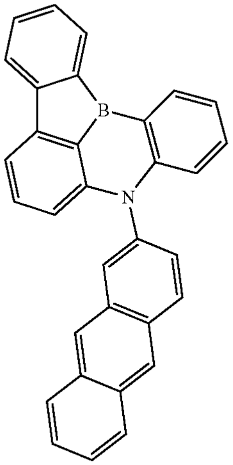
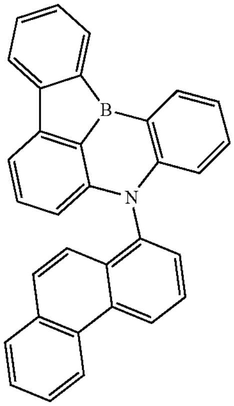
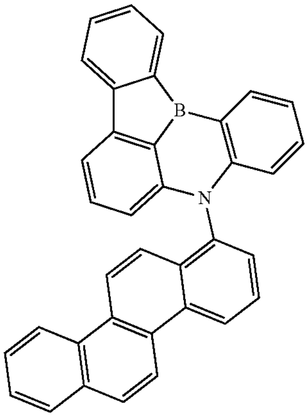
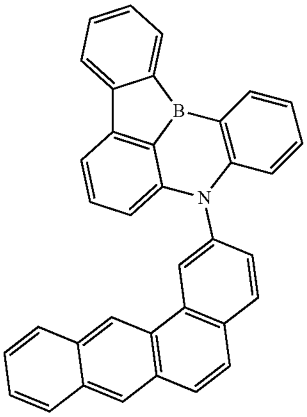
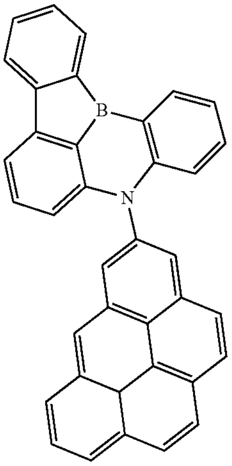

-continued
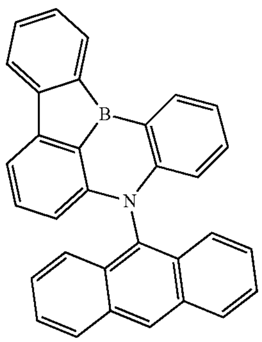
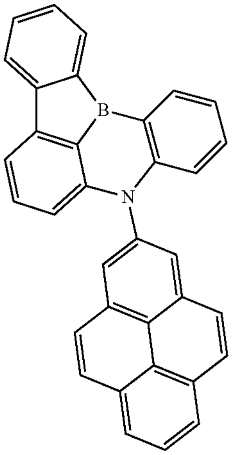
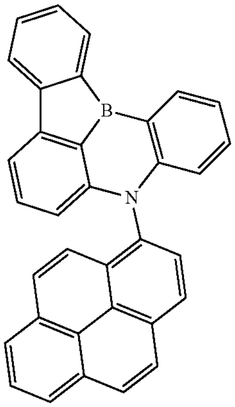
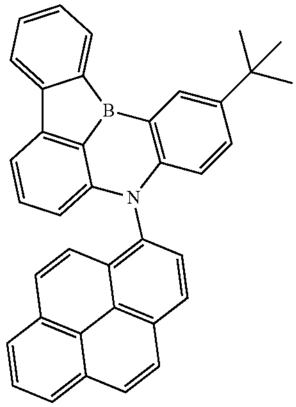
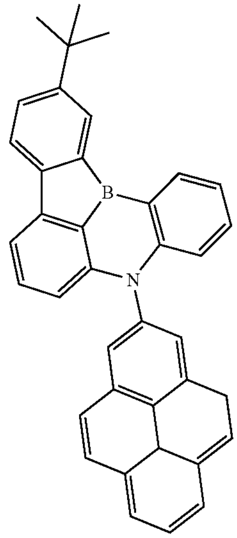
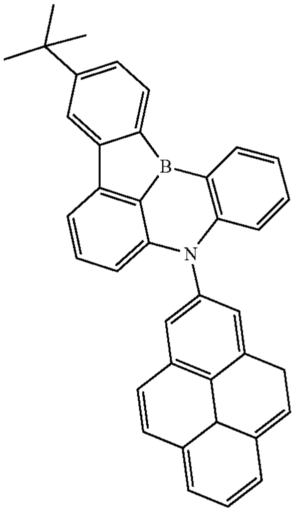
-continued
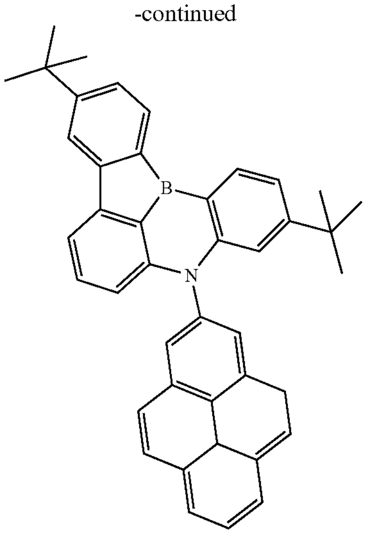
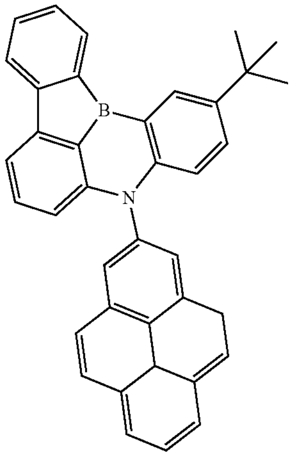
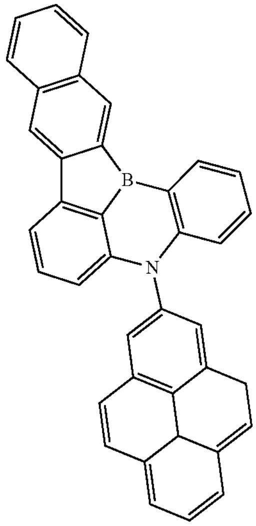
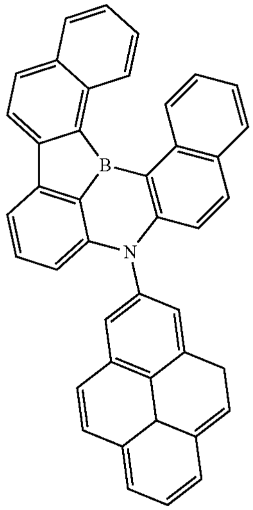

-continued
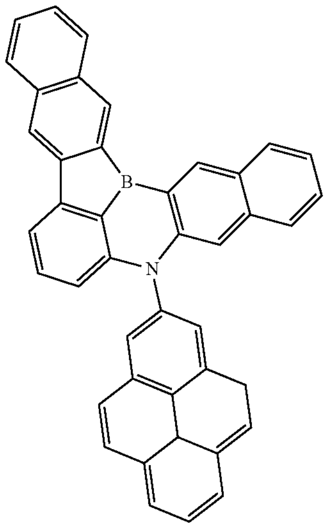
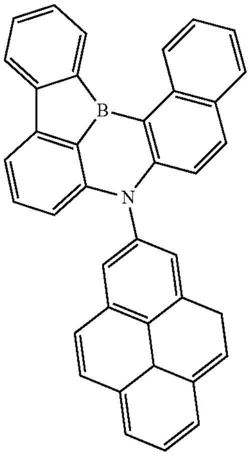
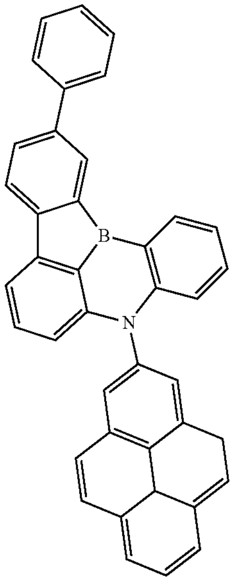
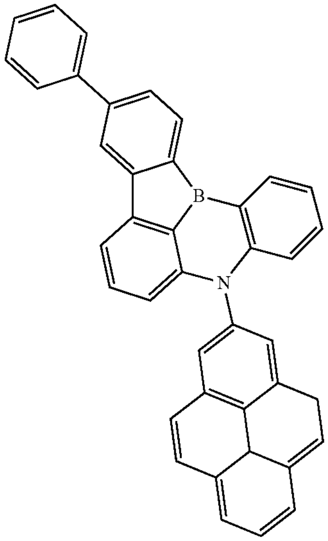
-continued
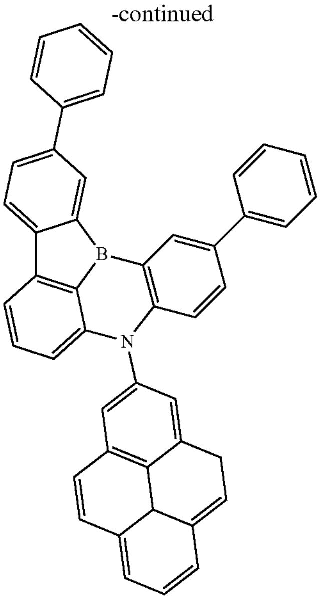
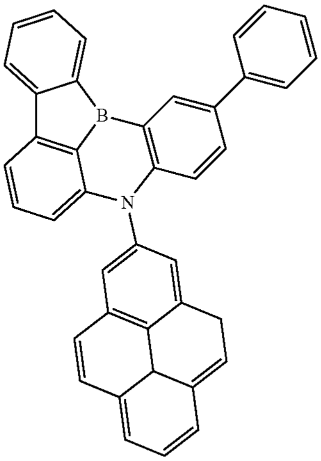
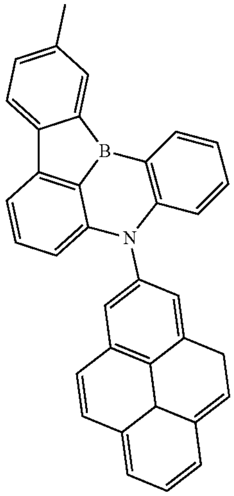
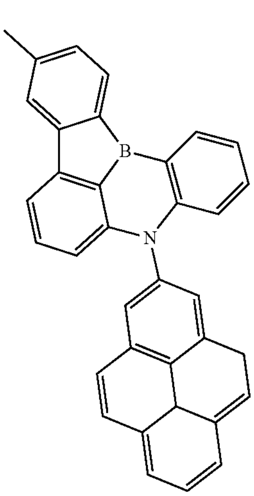

-continued
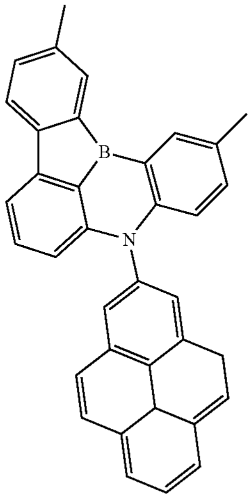
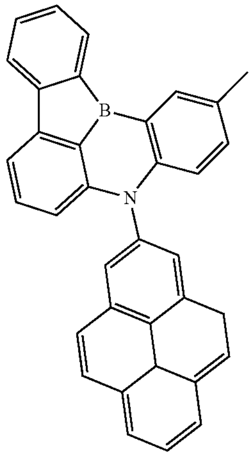
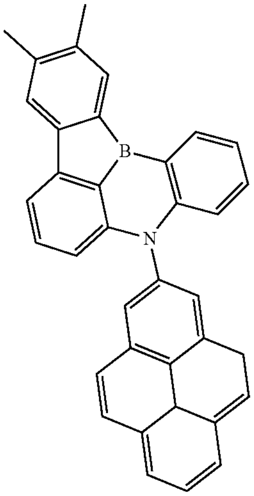
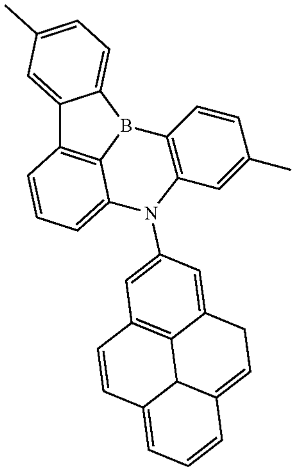
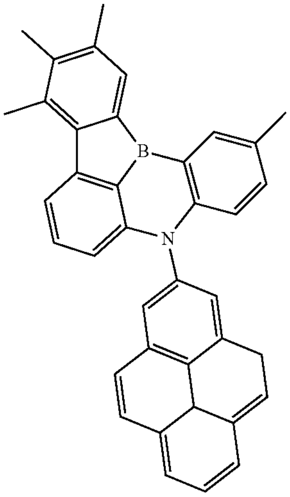
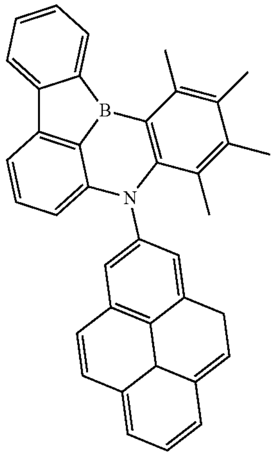
-continued
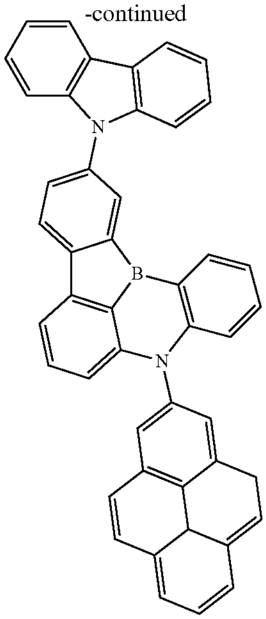
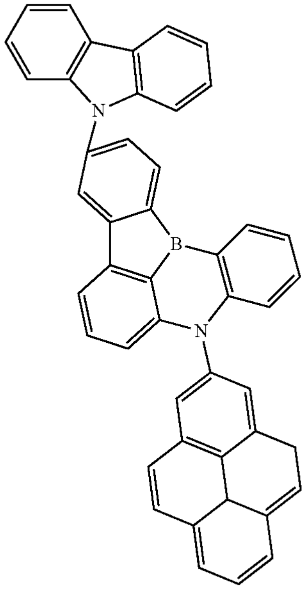

-continued
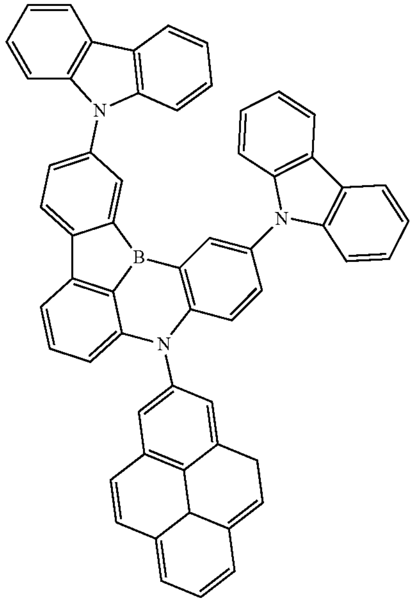
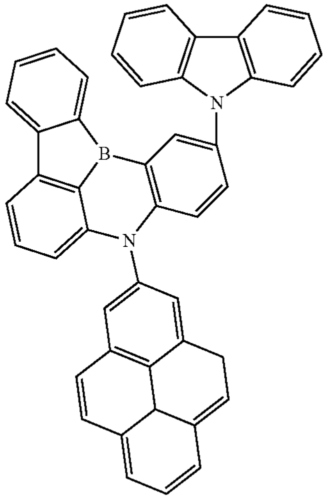
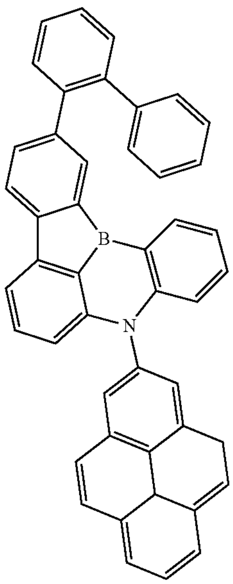
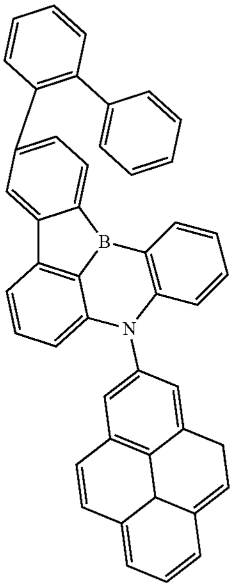
-continued
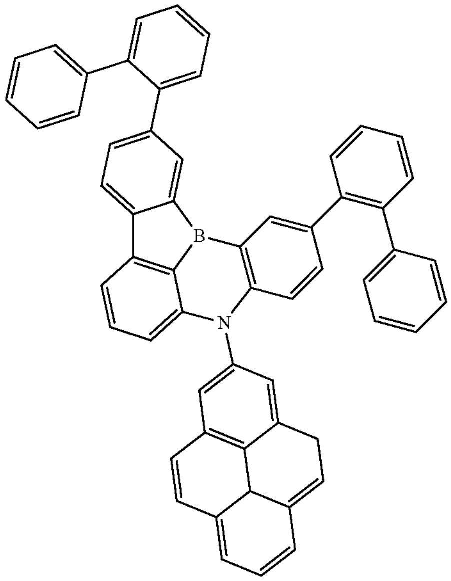
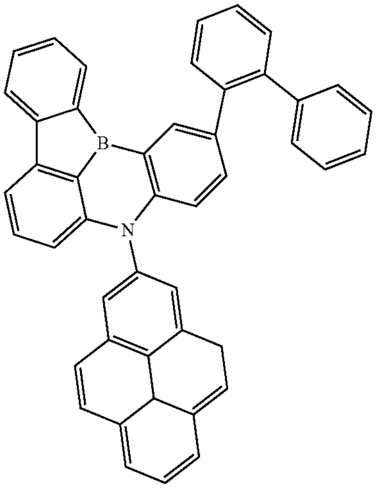
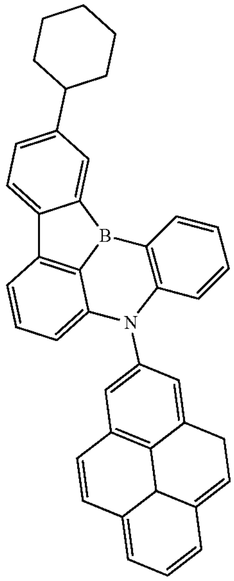
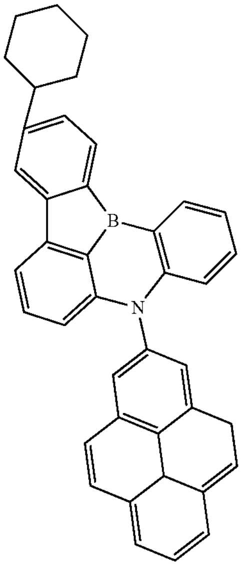

-continued
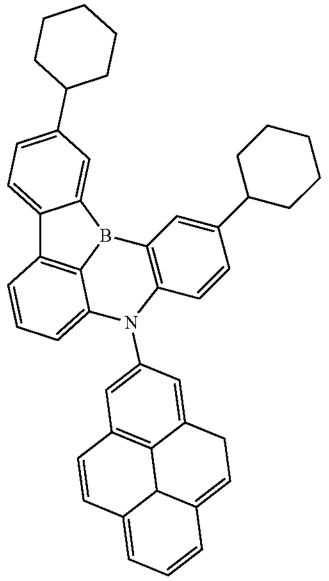
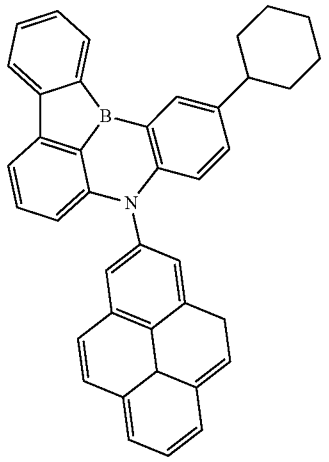
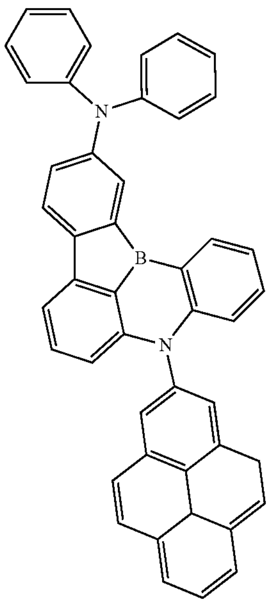
-continued
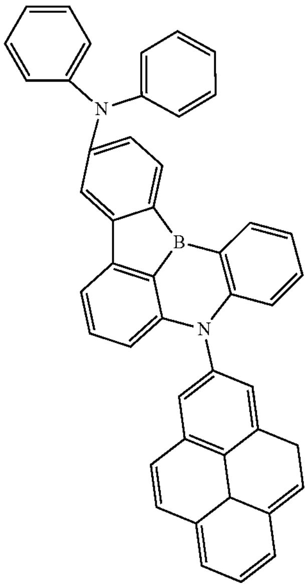
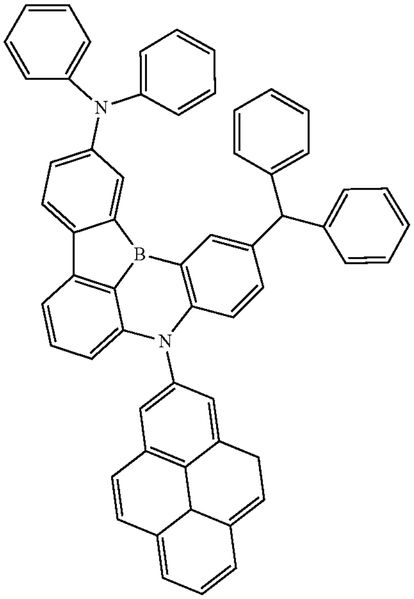
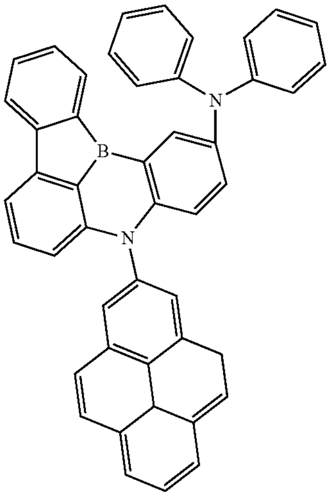

-continued
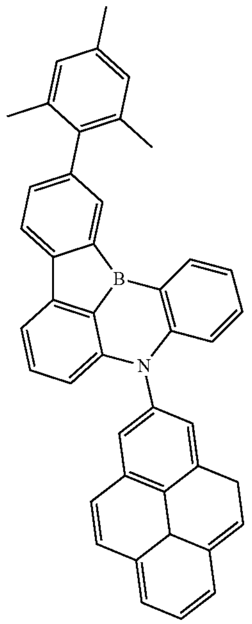
-continued
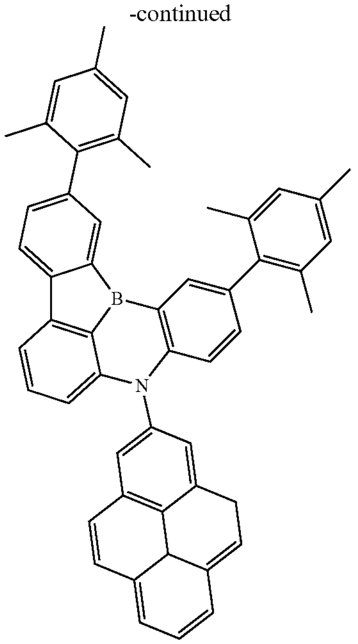
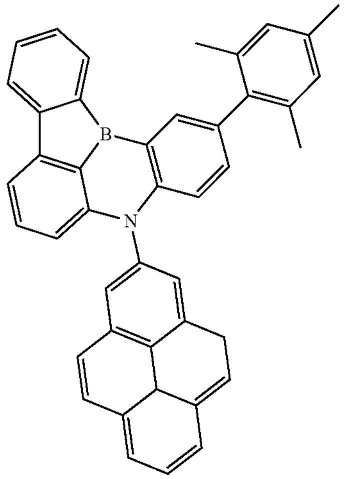
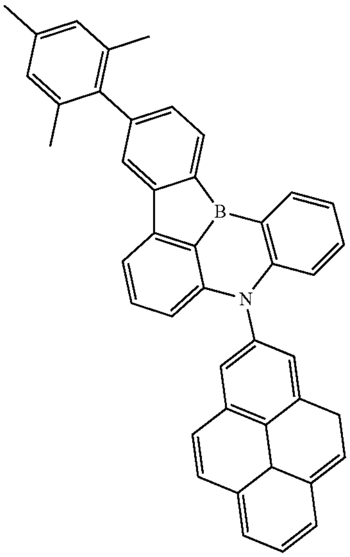
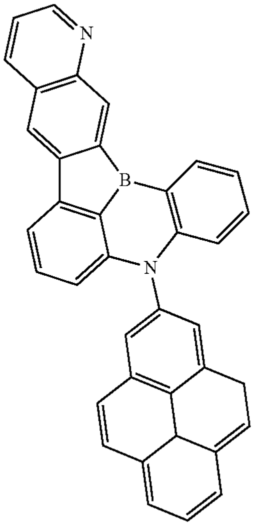
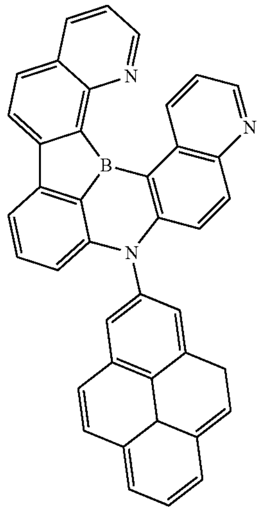

-continued
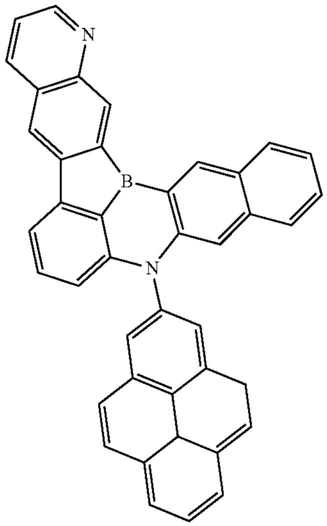
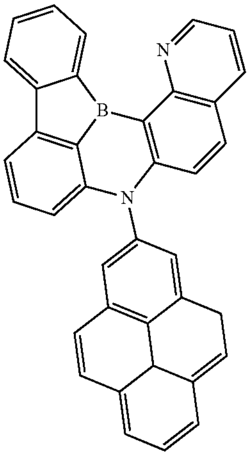
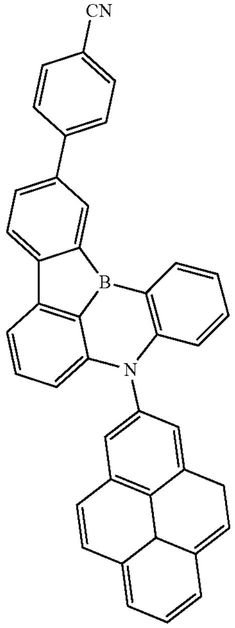
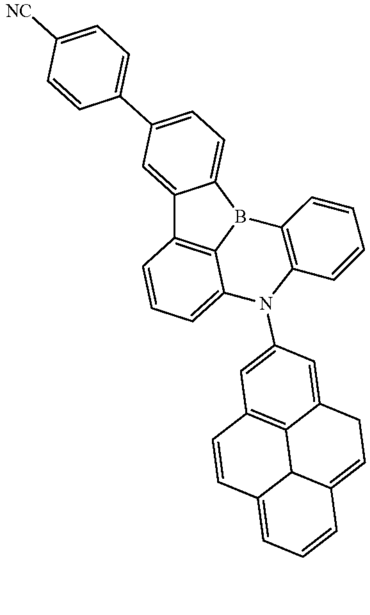
-continued
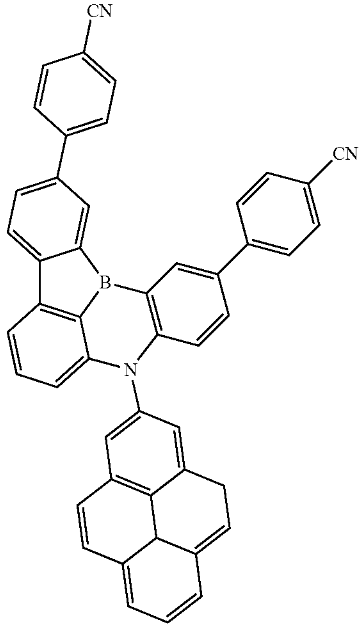
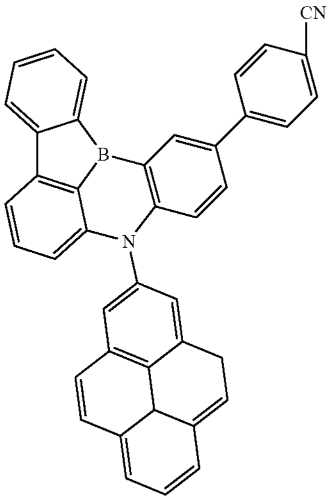
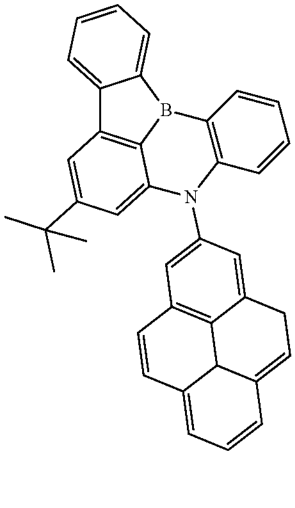
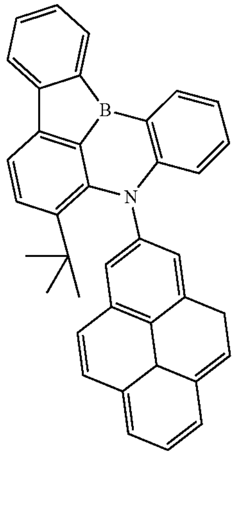

-continued
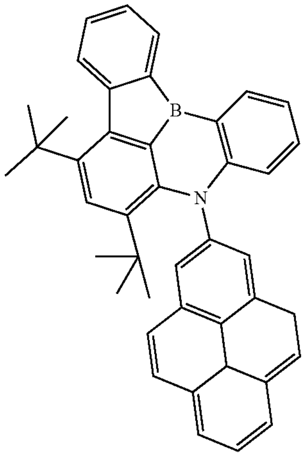
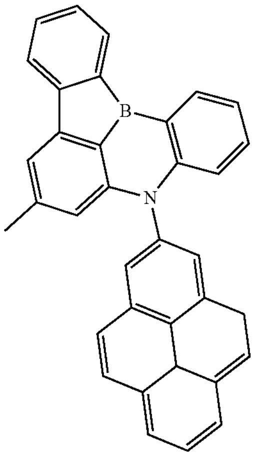
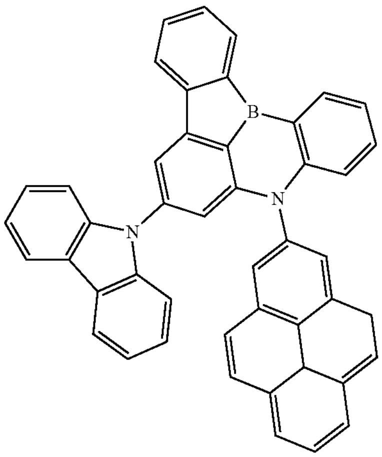
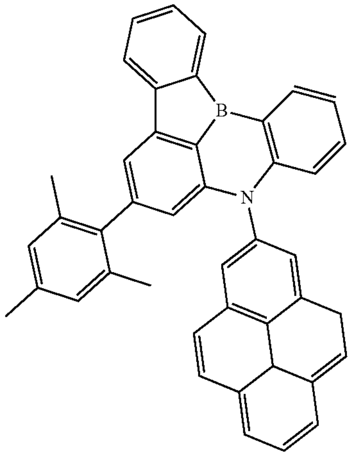
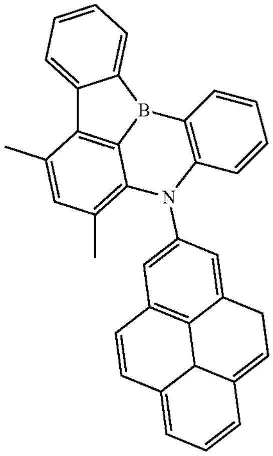
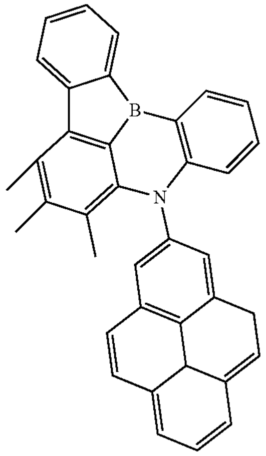
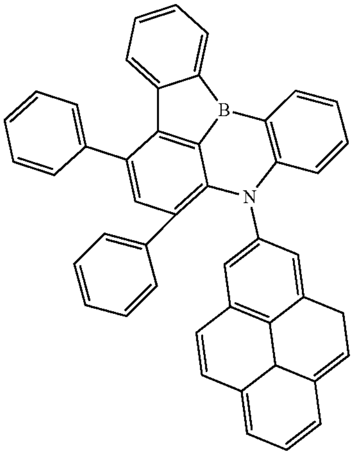
-continued

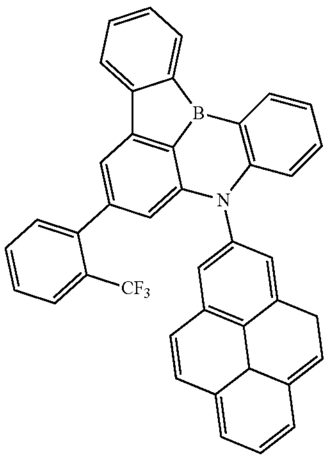
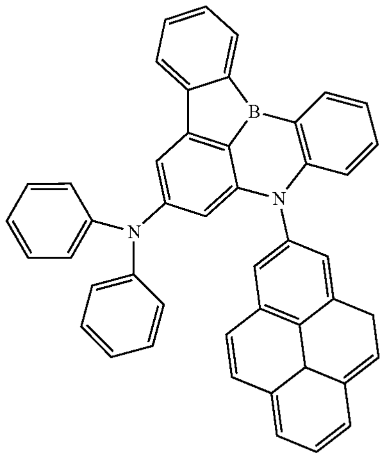
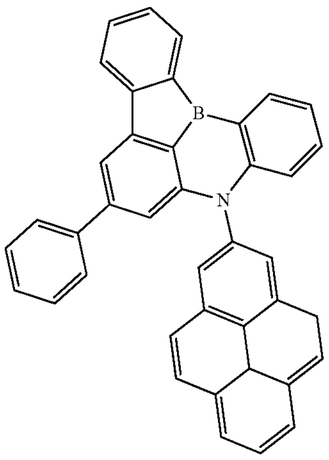
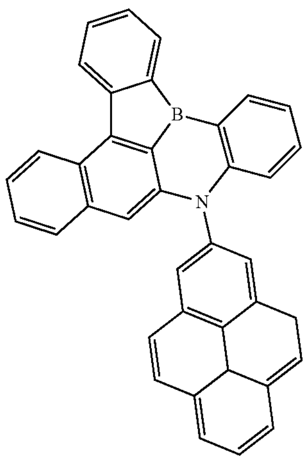
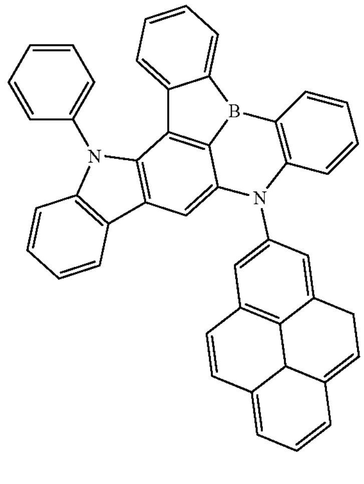
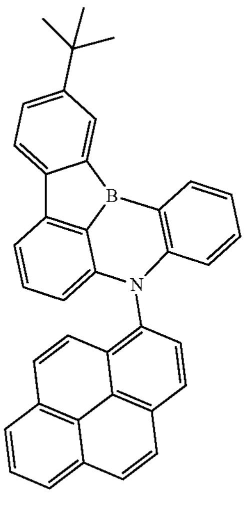
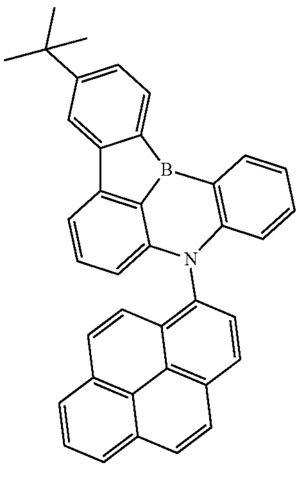

-continued
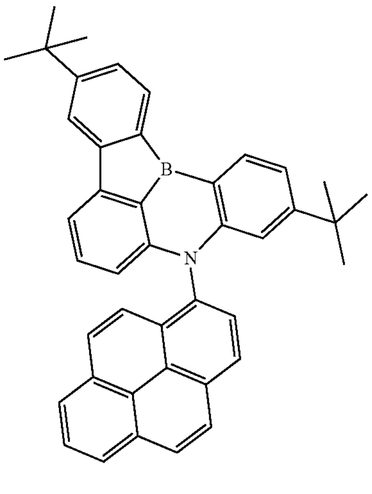
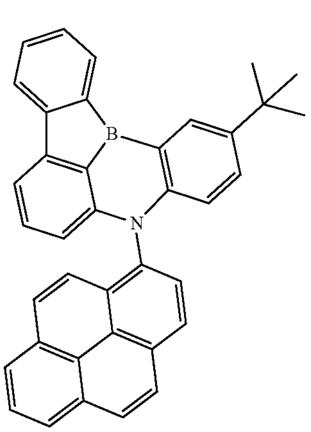
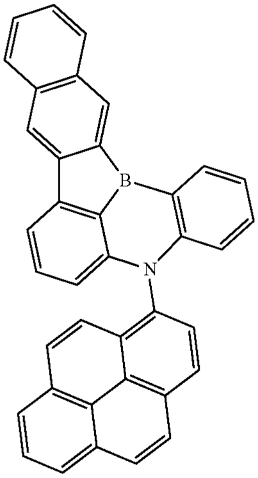
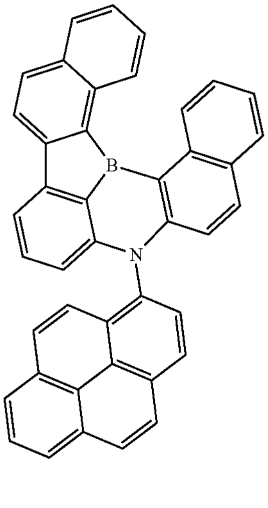
-continued
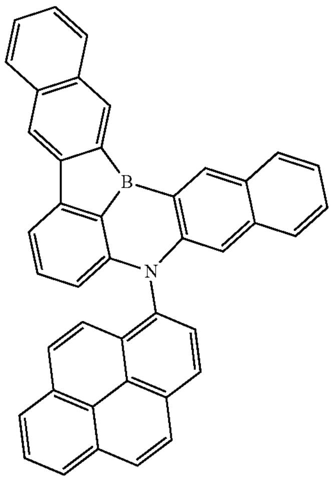
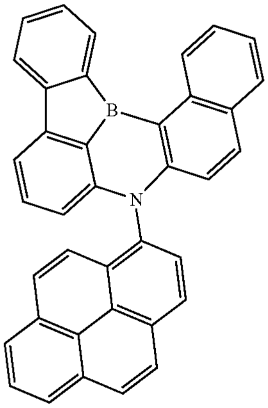
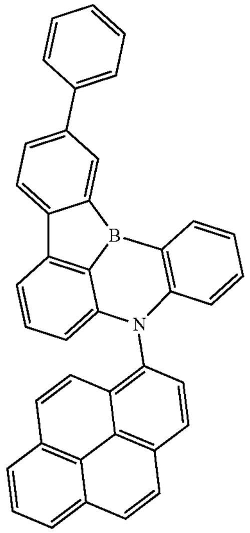
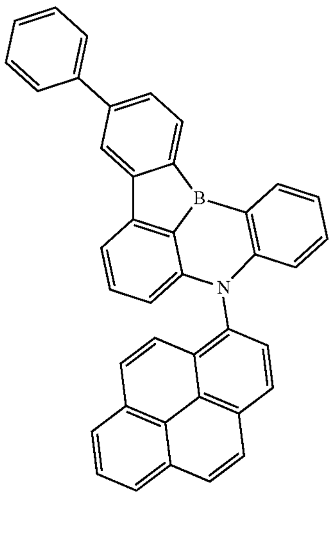

-continued
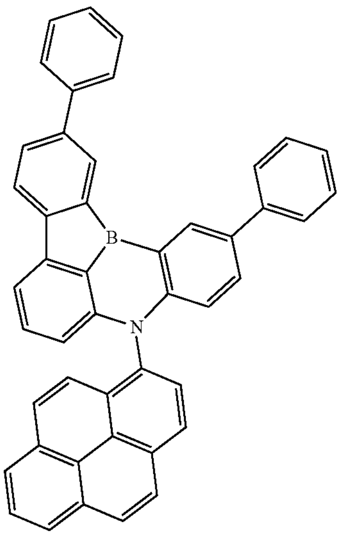
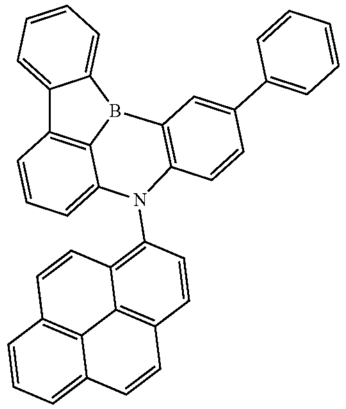
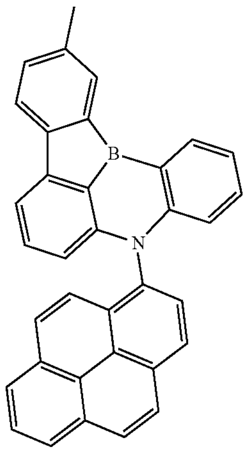
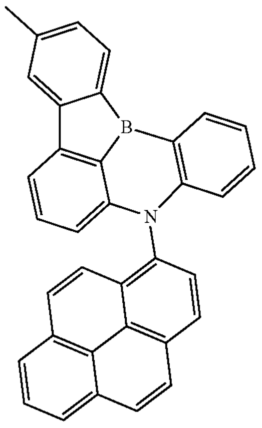
-continued
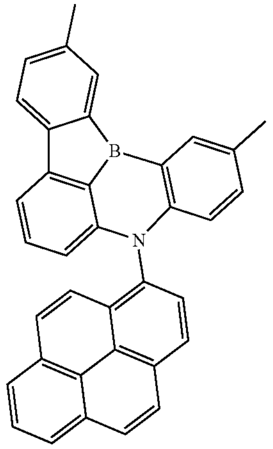
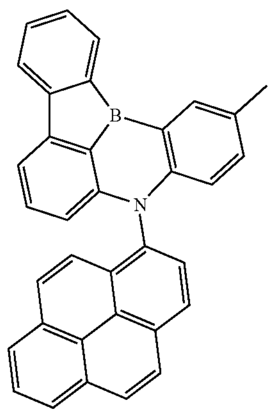
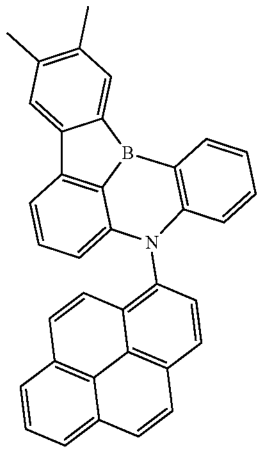
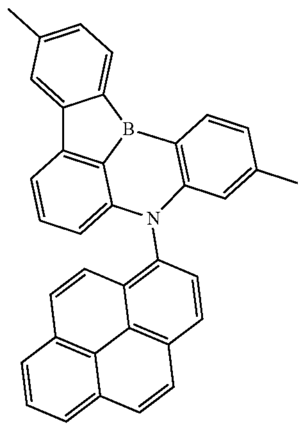
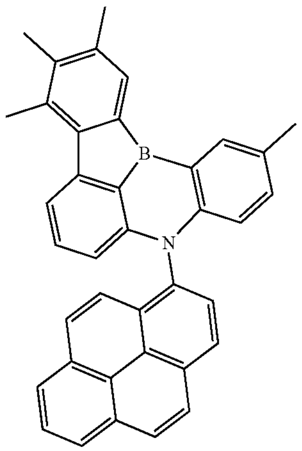

-continued
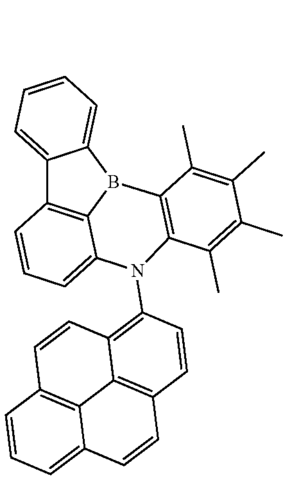
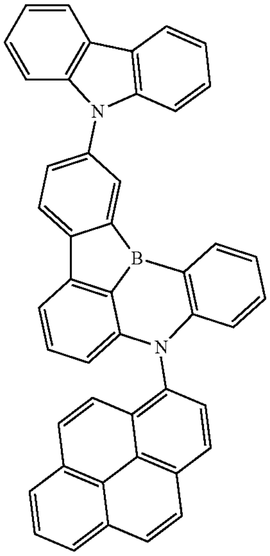
-continued
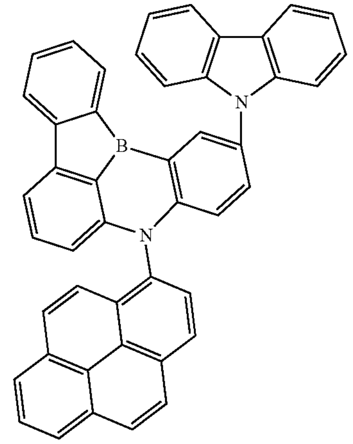
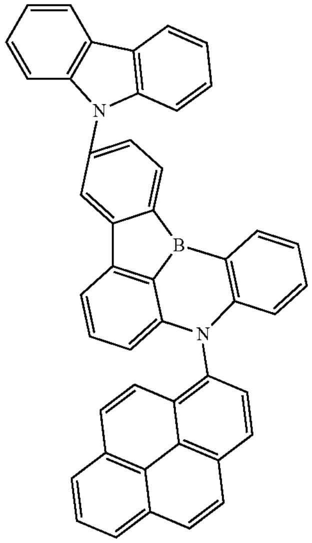
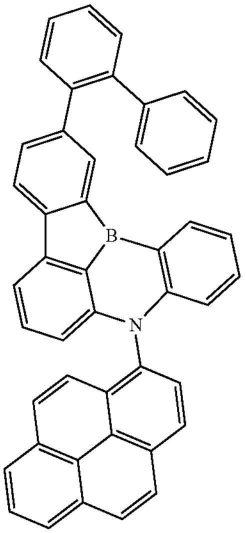
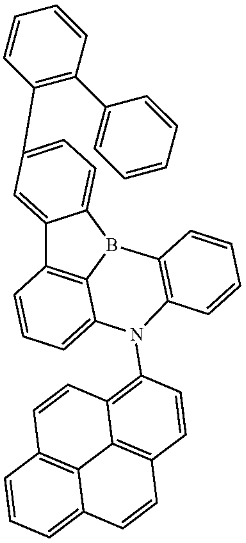
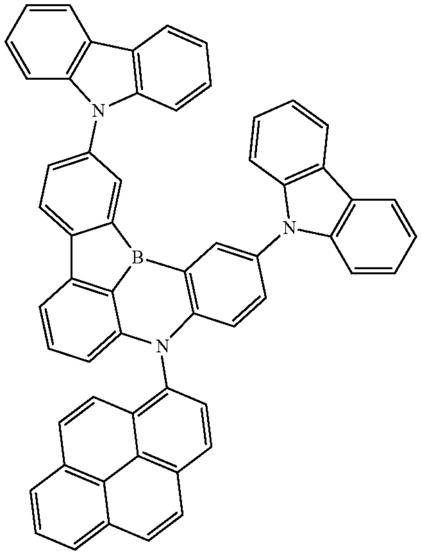
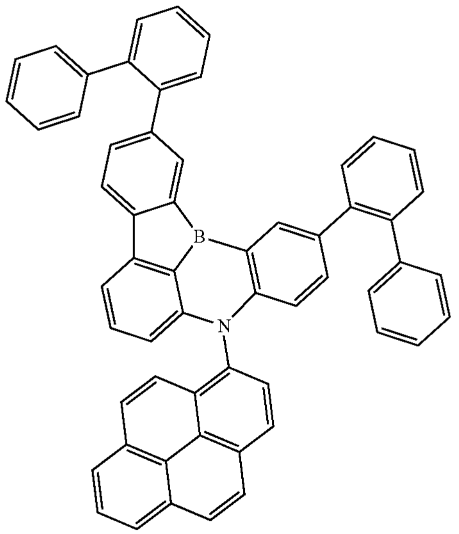

-continued
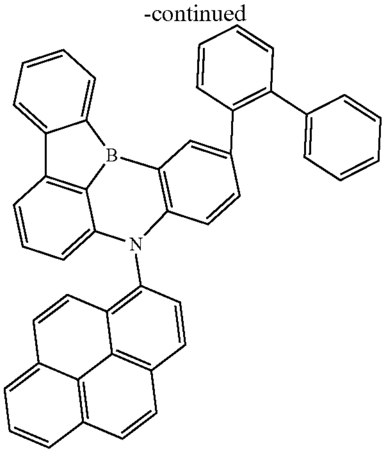
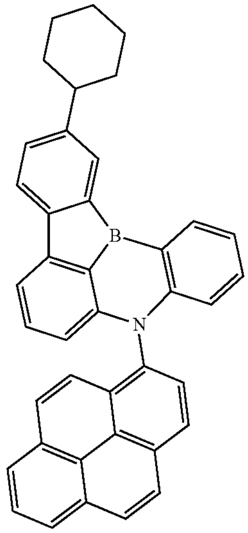
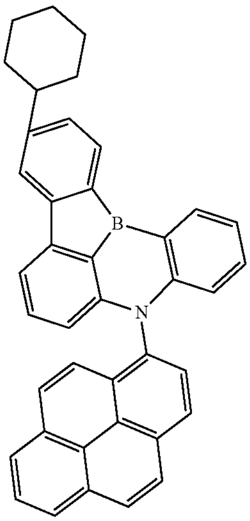
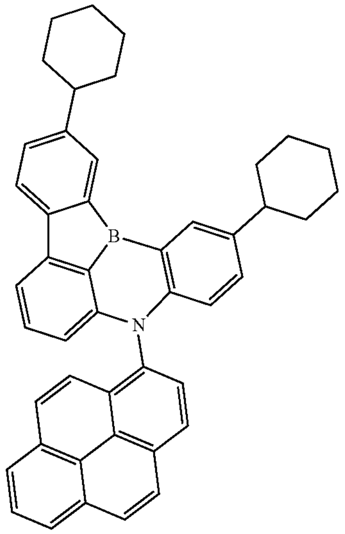
-continued
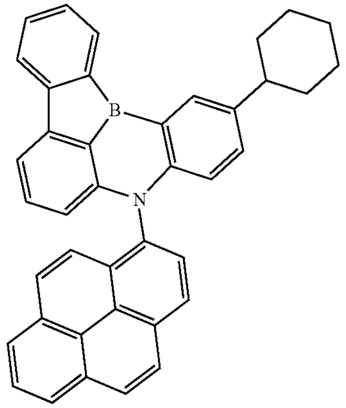
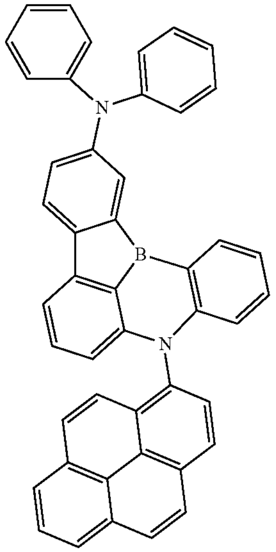
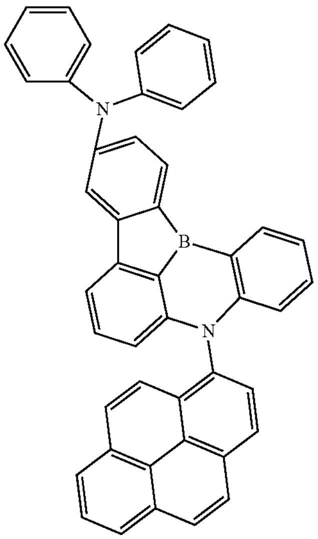

-continued
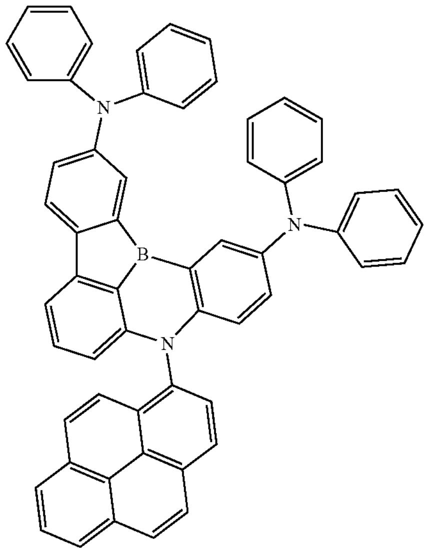
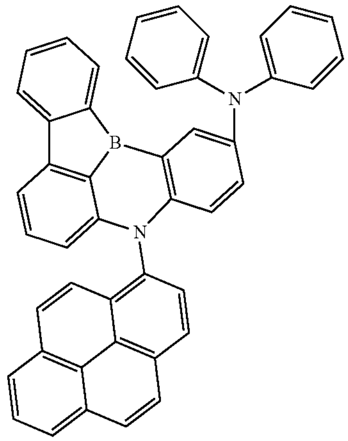
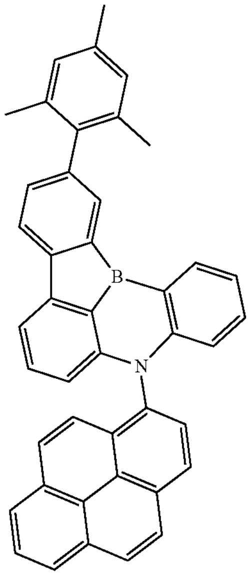
-continued
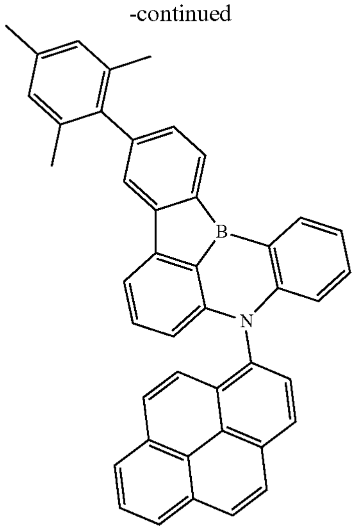
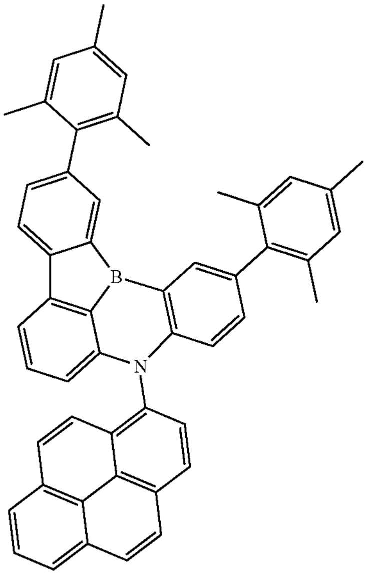
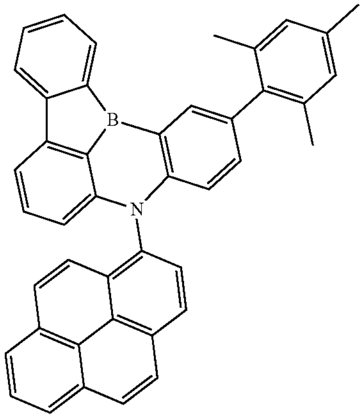

-continued
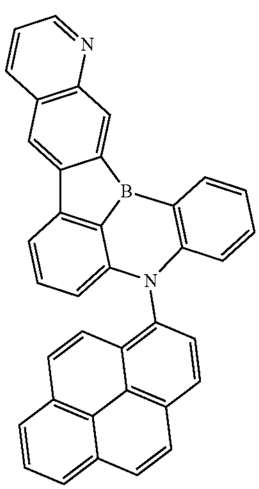
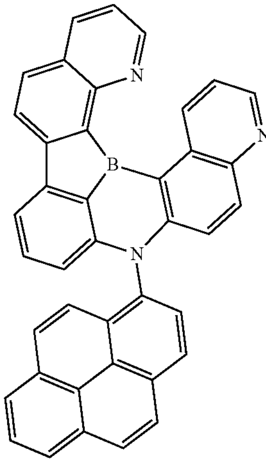
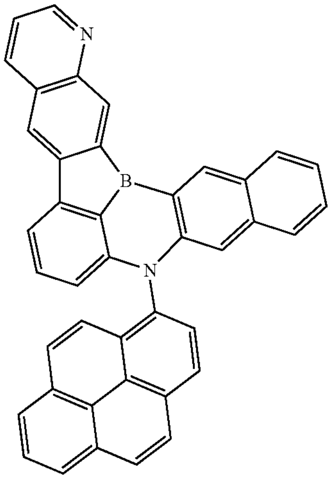
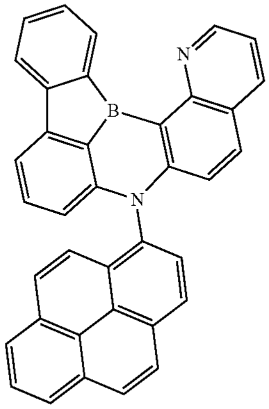
-continued
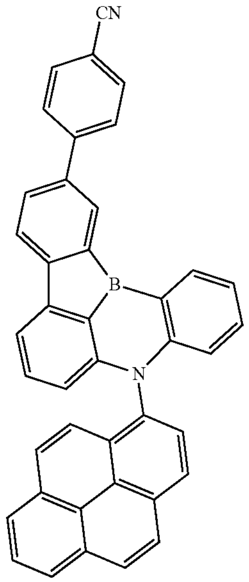
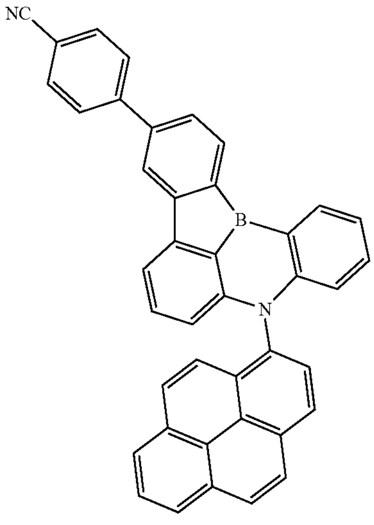
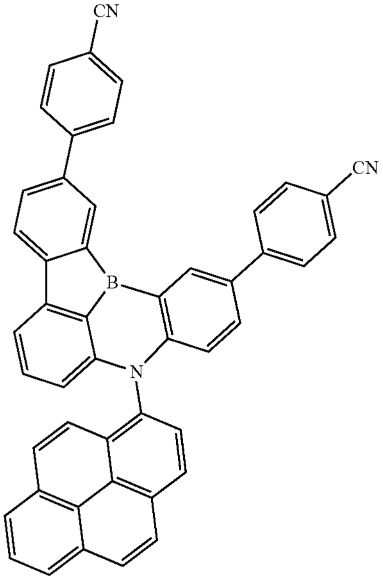

-continued
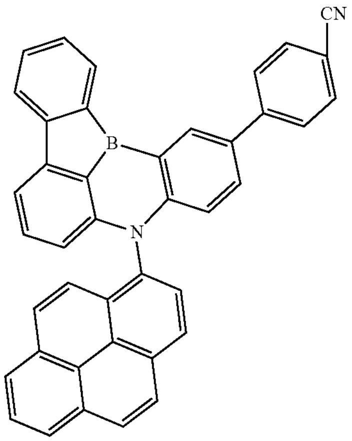
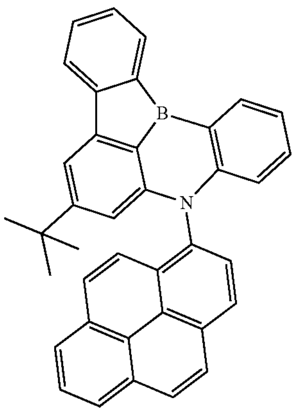
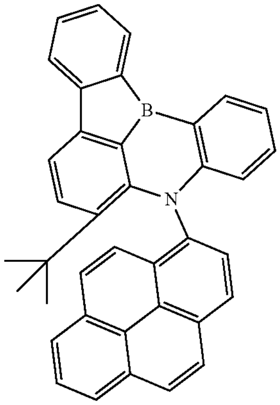
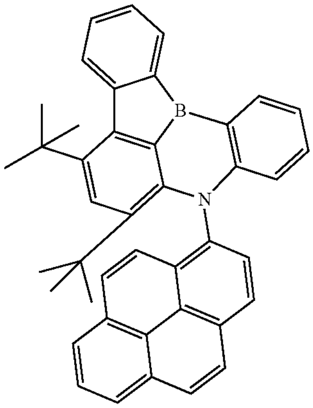
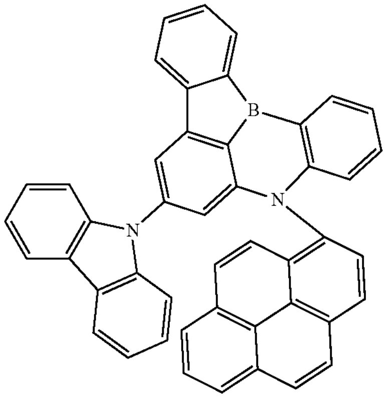
-continued
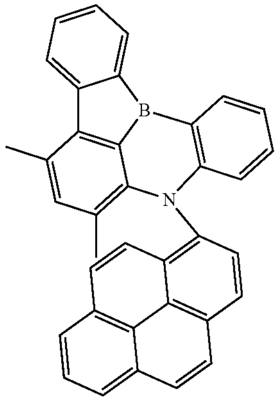
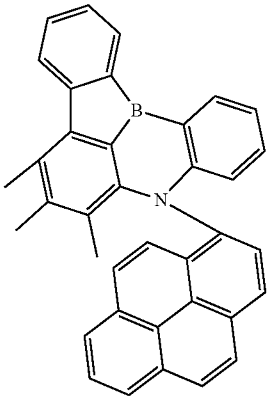
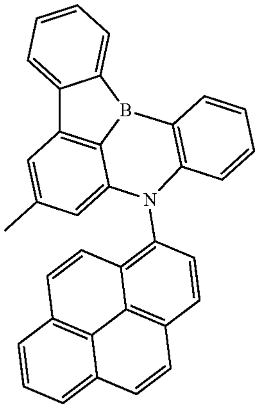
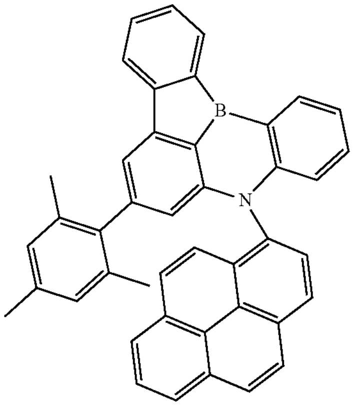
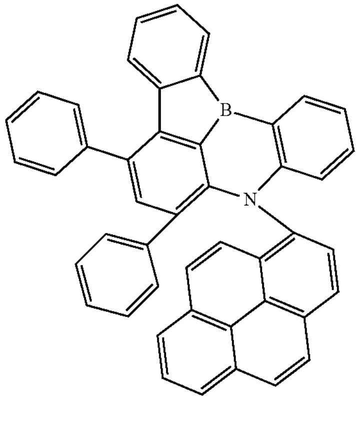

-continued
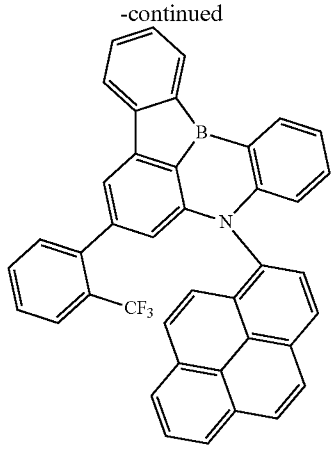
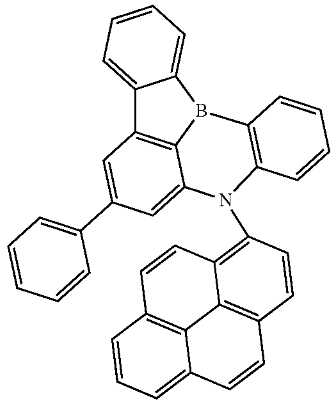
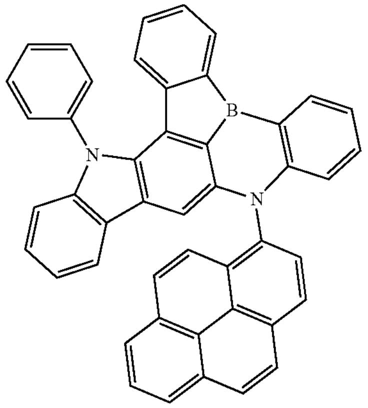
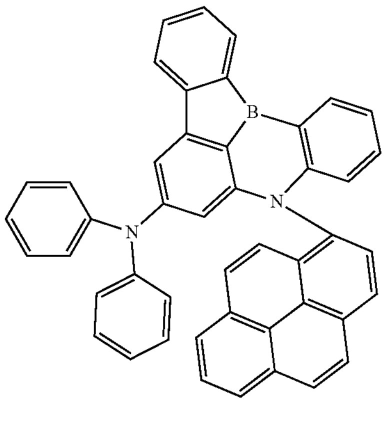
-continued
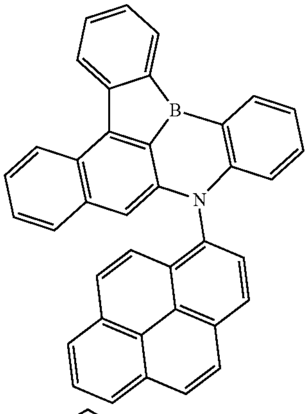
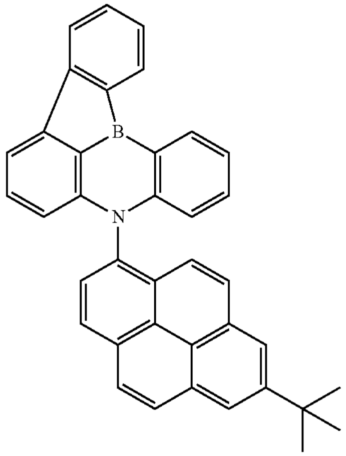
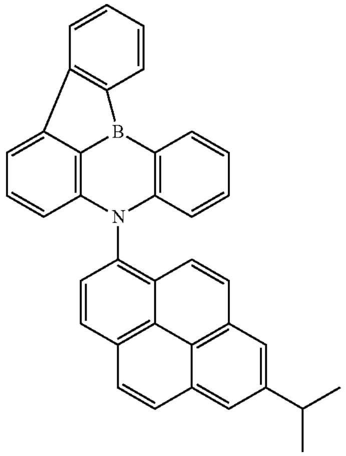
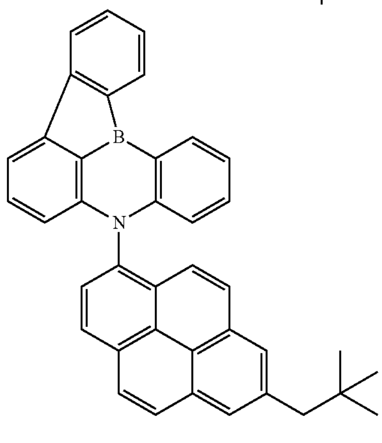

-continued
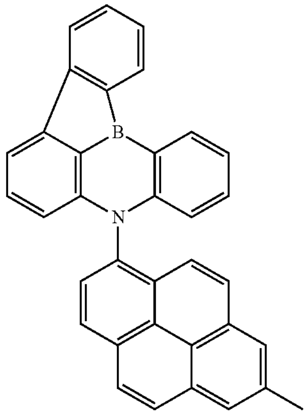
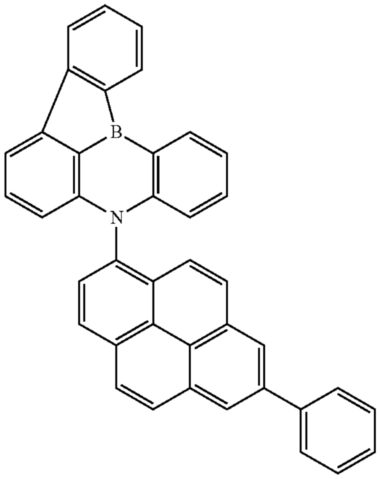
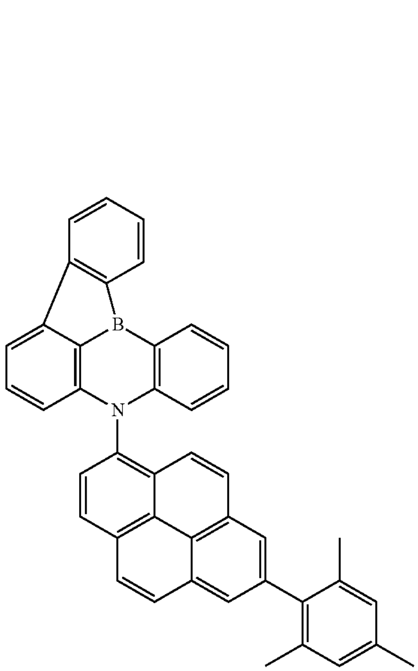
-continued
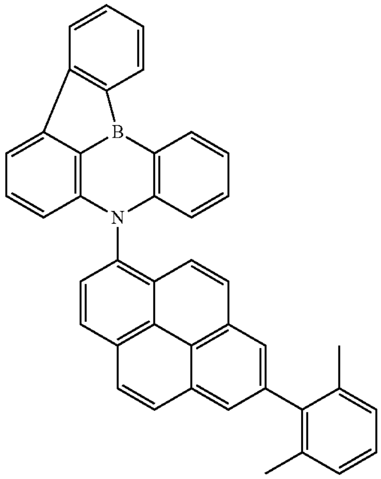
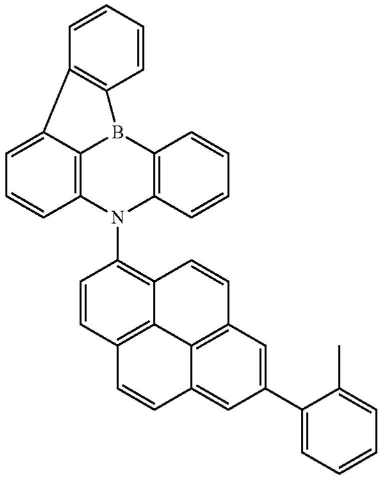
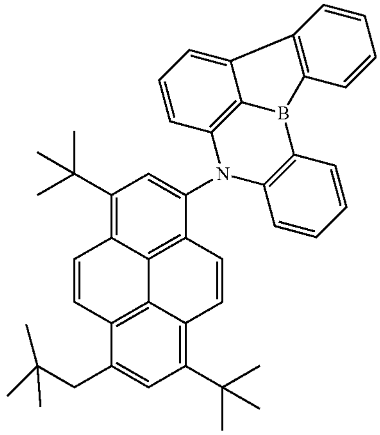

-continued
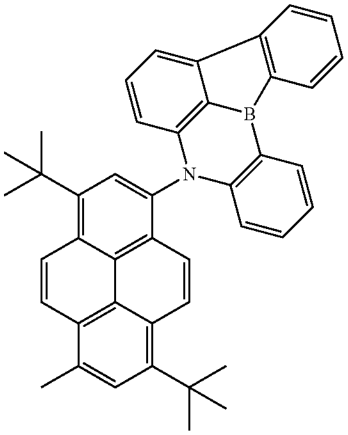
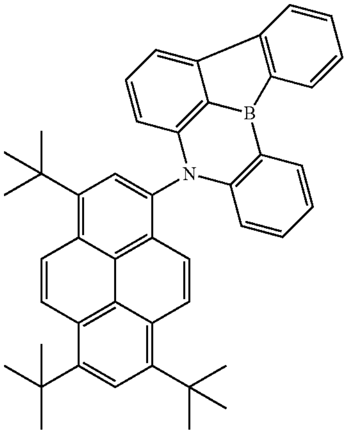
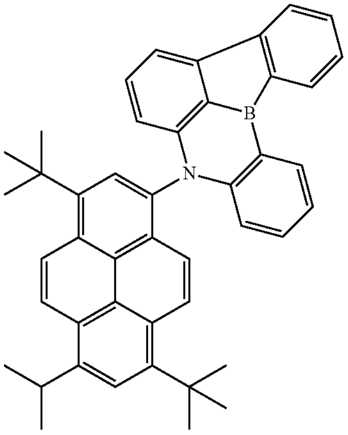
-continued
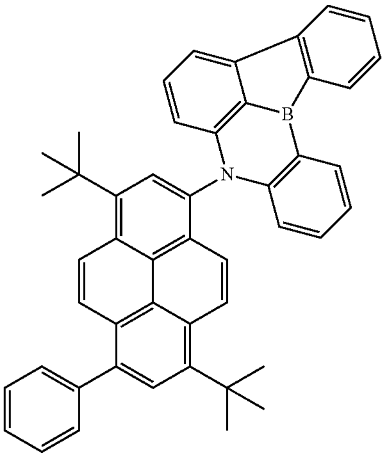
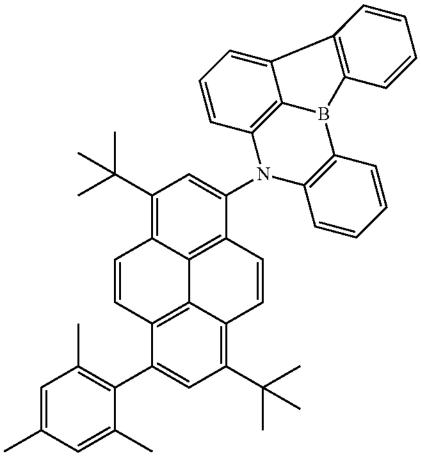
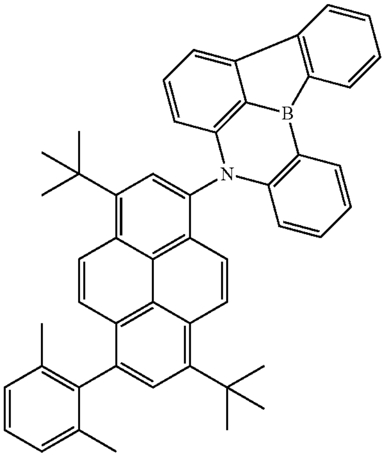

-continued
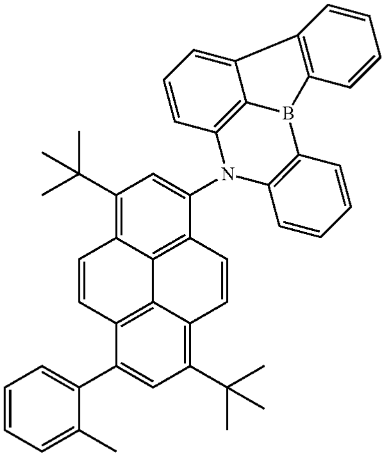
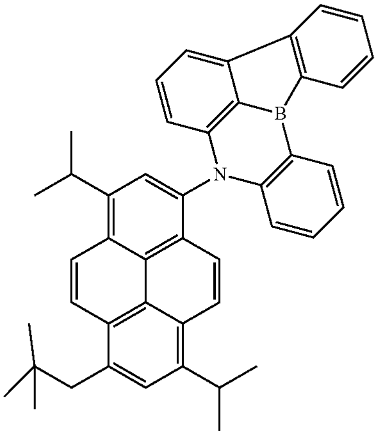
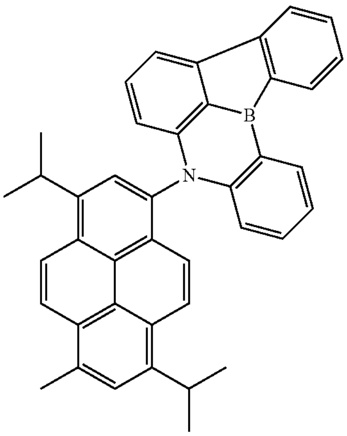
-continued
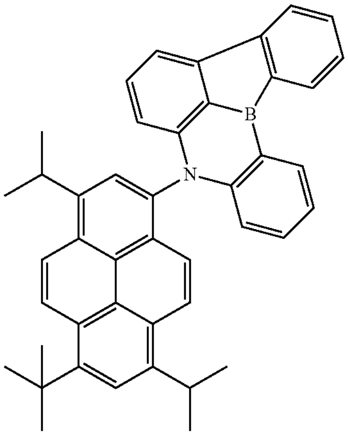
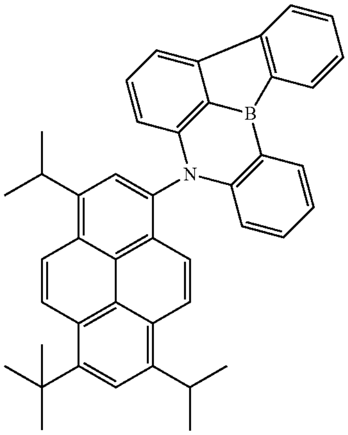
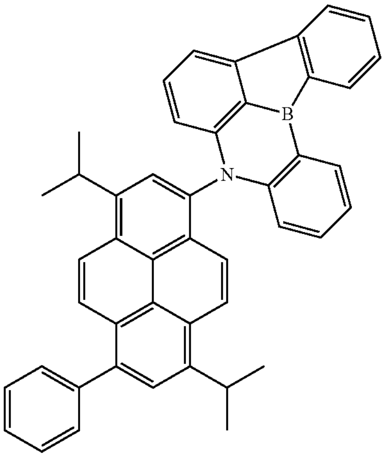

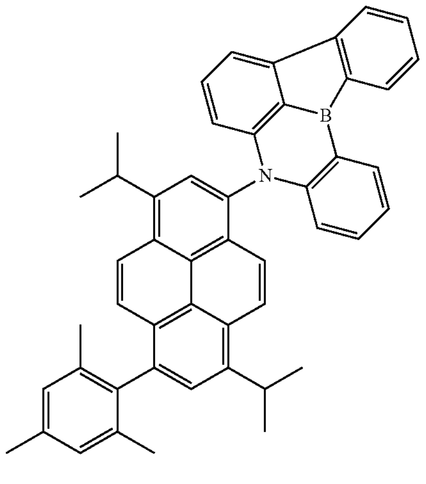
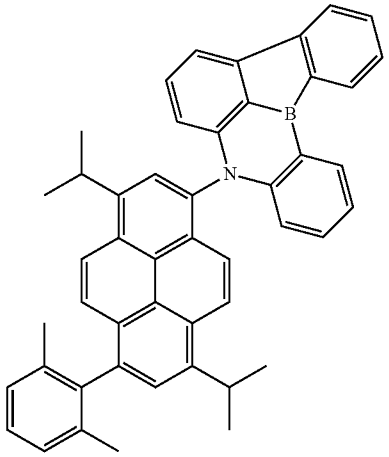
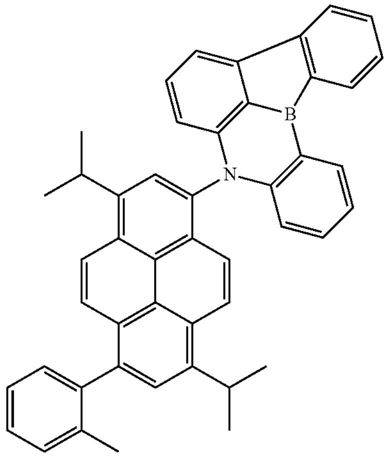
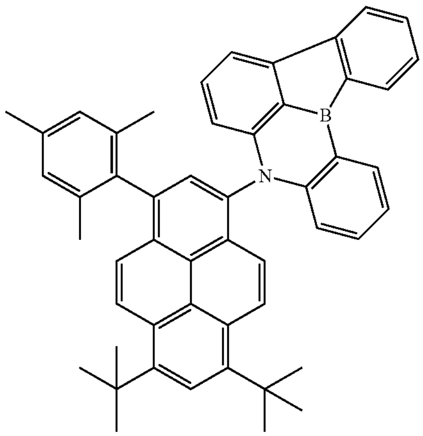
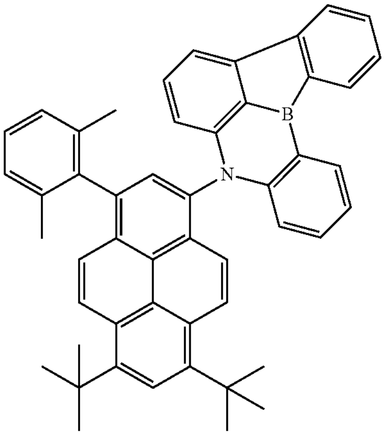
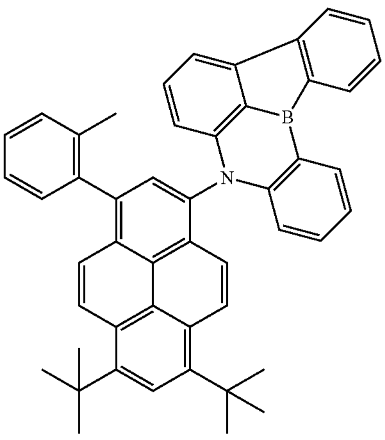

-continued
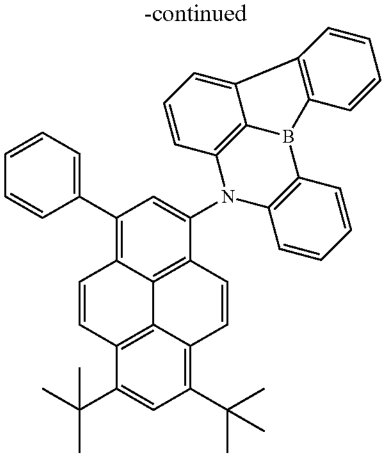
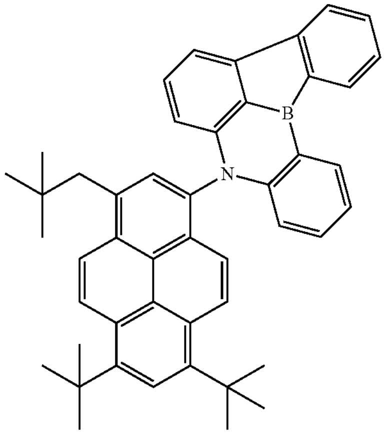
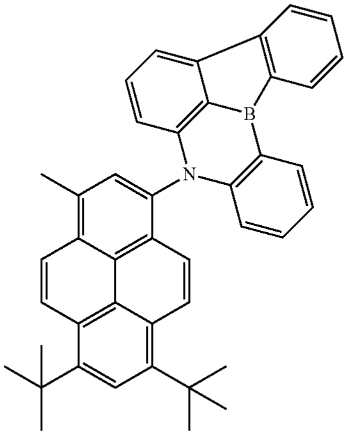
-continued
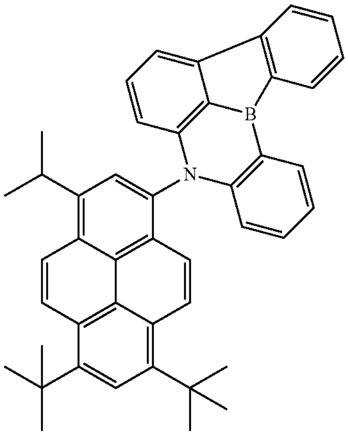
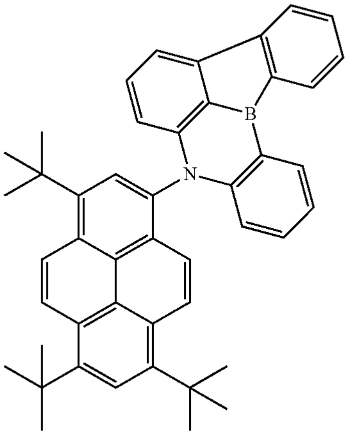
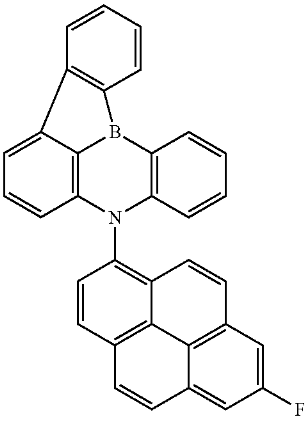
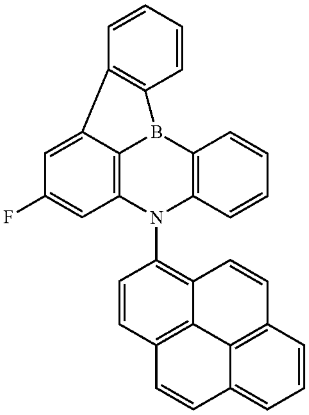

-continued
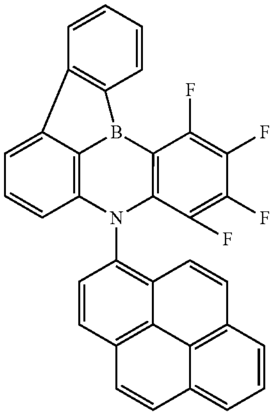
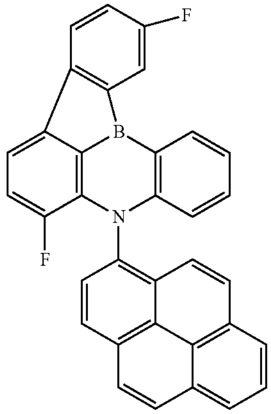
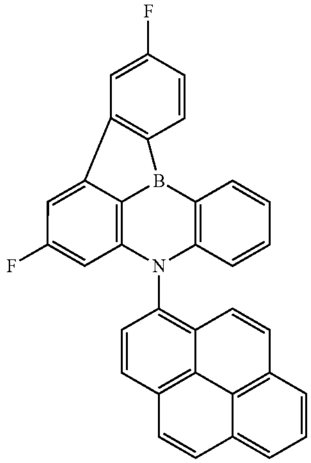
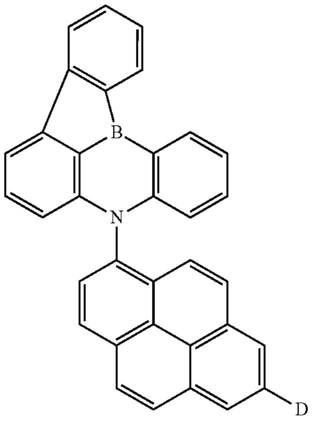
-continued
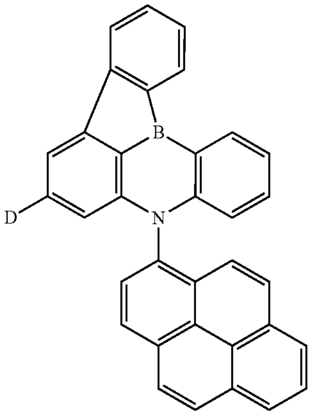
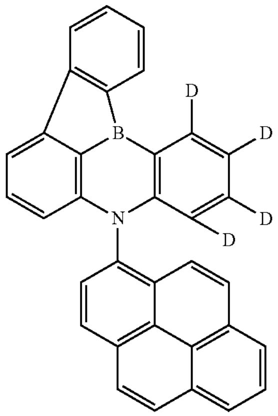
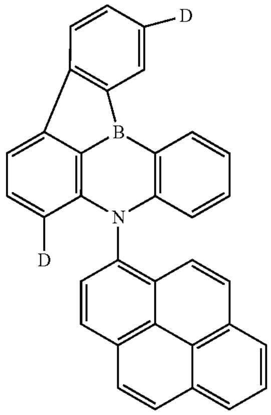
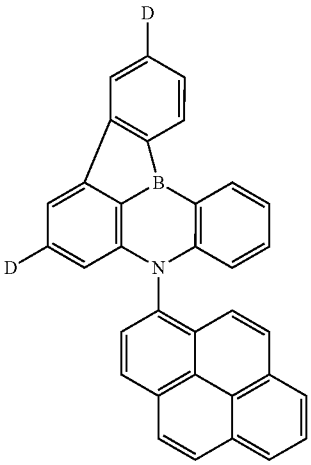 [SMILES: Fc1ccc2c(c1)-c1cc(F)cc3c1B2c1ccccc1N3c1ccc2ccc3cccc4ccc1c2c34]

-continued

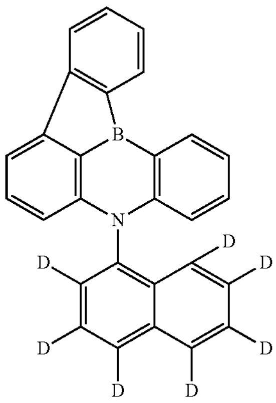

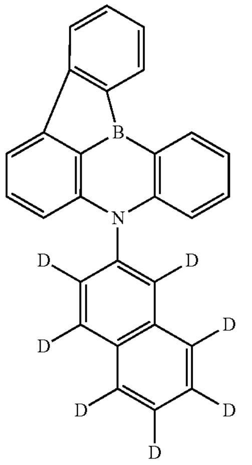

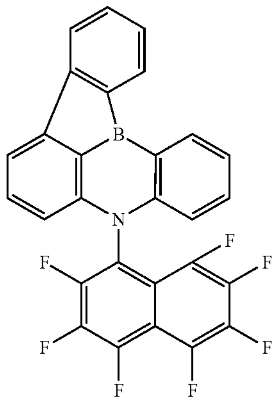

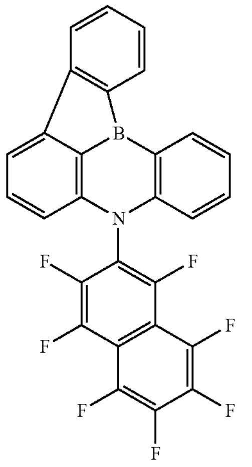

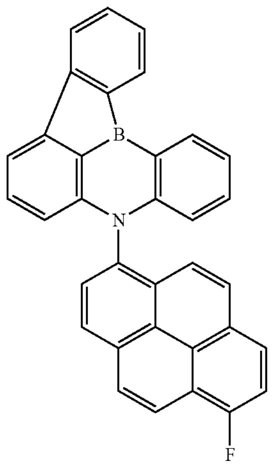

The invention claimed is:

1. An organic molecule, comprising a structure represented by Formula I:

Formula I

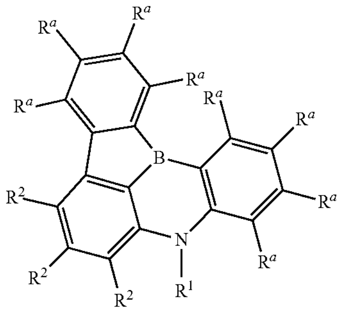

wherein in Formula I, $R^1$ is a $C_9$-$C_{60}$-polycyclic aryl group comprising at least two rings fused together, which is optionally substituted with one or more substituents $R^4$;

$R^a$ and $R^2$ are at each occurrence independently selected from the group consisting of:

hydrogen, deuterium, $N(R^3)_2$, $OR^3$, $SR^3$, $Si(R^3)_3$, $B(OR^3)_2$, $OSO_2R^3$, $CF_3$, CN, halogen;

$C_1$-$C_{40}$-alkyl, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, $C{=}O$, $C{=}S$, $C{=}Se$, $C{=}NR^3$, $P({=}O)(R^3)$, SO, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, $C{=}O$, $C{=}S$, $C{=}Se$, $C{=}NR^3$, $P({=}O)(R^3)$, SO, $SO_2$, $NR^3$, O, S or $CONR^3$;

$C_1$-$C_{40}$-thioalkoxy, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, $C{=}O$, $C{=}S$, $C{=}Se$, $C{=}NR^3$, $P({=}O)(R^3)$, SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, $C{=}O$, $C{=}S$, $C{=}Se$, $C{=}NR^3$, $P({=}O)(R^3)$, SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, $C{\equiv}C$, $Si(R^3)_2$, $Ge(R^3)_2$, $Sn(R^3)_2$, $C{=}O$, $C{=}S$, $C{=}Se$, $C{=}NR^3$, $P({=}O)(R^3)$, SO, $SO_2$, $NR^3$, O, S or $CONR^3$;

$C_6$-$C_{60}$-aryl, which is optionally substituted with one or more substituents $R^3$; and $C_3$-$C_{57}$-heteroaryl, which is optionally substituted with one or more substituents $R^3$;

$R^3$ is independently selected from the group consisting of: hydrogen, deuterium, $N(R^4)_2$, $OR^4$, $SR^4$, $Si(R^4)_3$, $B(OR^4)_2$, $OSO_2R^4$, $CF_3$, CN, halogen;

$C_1$-$C_{40}$-alkyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_1$-$C_{40}$-alkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_1$-$C_{40}$-thioalkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_2$-$C_{40}$-alkenyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_2$-$C_{40}$-alkynyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_6$-$C_{60}$-aryl, which is optionally substituted with one or more substituents $R^4$; and $C_3$-$C_{57}$-heteroaryl, which is optionally substituted with one or more substituents $R^4$;

$R^4$ is at each occurrence independently from one another selected from the group consisting of:

hydrogen, deuterium, halogen, OPh, SPh, $CF_3$, CN, $Si(C_1$-$C_5$-alkyl$)_3$, $Si(Ph)_3$;

$C_1$-$C_5$-alkyl, wherein optionally one or more hydrogen atoms are independently substituted by deuterium, halogen, CN, or $CF_3$;

$C_1$-$C_5$-alkoxy, wherein optionally one or more hydrogen atoms are independently substituted by deuterium, halogen, CN, or $CF_3$;

$C_1$-$C_5$-thioalkoxy, wherein optionally one or more hydrogen atoms are independently substituted by deuterium, halogen, CN, or $CF_3$;

$C_2$-$C_5$-alkenyl, wherein optionally one or more hydrogen atoms are independently substituted by deuterium, halogen, CN, or $CF_3$;

$C_2$-$C_5$-alkynyl, wherein optionally one or more hydrogen atoms are independently substituted by deuterium, halogen, CN, or $CF_3$;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl$)$;

wherein adjacent groups $R^a$ optionally are bonded to each other to form an aryl or heteroaryl ring, which is optionally substituted with one or more $C_1$-$C_5$-alkyl substituents, deuterium, halogen, CN or $CF_3$;

wherein adjacent groups $R^2$ optionally are bonded to each other to form an aryl or heteroaryl ring, which is optionally substituted with one or more $C_1$-$C_5$-alkyl substituents, deuterium, halogen, CN or $CF_3$; and wherein at least one hydrogen atom of the organic molecule may be substituted by a halogen atom or a deuterium atom.

2. The organic molecule according to claim 1, comprising the structure represented by Formula Ia, Ib, Ic or Id:

Formula Ia

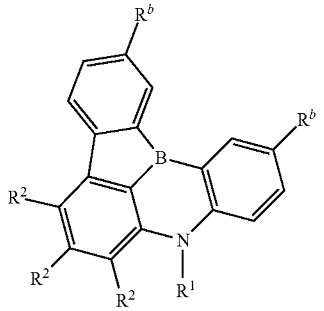

Formula Ib

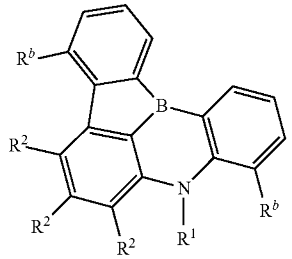

Formula Ic

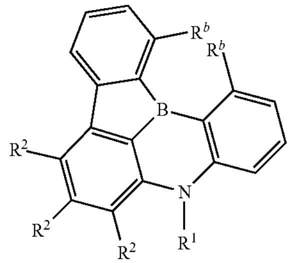

-continued

Formula Id

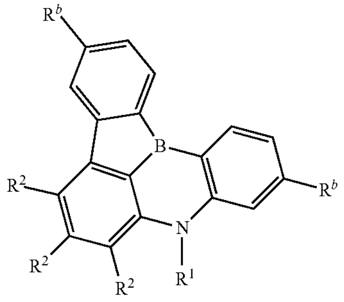

wherein in Formulae Ia to Id, $R^b$ is at each occurrence independently selected from the group consisting of:

hydrogen, deuterium, $N(R^3)_2$, $OR^3$, $SR^3$, $Si(R^3)_3$, $B(OR^3)_2$, $OSO_2R^3$, $CF_3$, CN, halogen;

$C_1$-$C_{40}$-alkyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_1$-$C_{40}$-thioalkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_6$-$C_{60}$-aryl, which is optionally substituted with one or more substituents $R^3$; and $C_3$-$C_{57}$-heteroaryl, which is optionally substituted with one or more substituents $R^3$.

3. The organic molecule according to claim 2, wherein $R^b$ is identical at each occurrence.

4. The organic molecule according to claim 2, wherein $R^b$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

5. The organic molecule according to claim 2, comprising the structure represented by Formula Ia:

Formula Ia

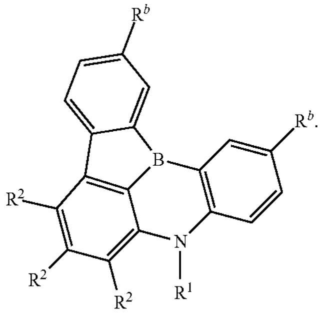

6. The organic molecule according to claim 1, wherein $R^a$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

7. The organic molecule according to claim 1, wherein $R^2$ is independently selected from the group consisting of:

hydrogen, Me, $^{i}$Pr, $^{t}$Bu, CN, $CF_3$,

Ph, which is optionally substituted with one or more substituents independently from each other selected from the group consisting of Me, $^{i}$Pr, $^{t}$Bu, CN, $CF_3$, and Ph, pyridinyl, which is optionally substituted with one or more substituents independently from each other selected from the group consisting of Me, $^{i}$Pr, $^{t}$Bu, CN, $CF_3$, and Ph, pyrimidinyl, which is optionally substituted with one or more substituents independently from each other selected from the group consisting of Me, $^{i}$Pr, $^{t}$Bu, CN, $CF_3$, and Ph, triazinyl, which is optionally substituted with one or more substituents independently from each other selected from the group consisting of Me, $^{i}$Pr, $^{t}$Bu, CN, $CF_3$, and Ph, and $N(Ph)_2$.

8. The organic molecule according to claim 1, wherein $R^1$ represents a pyrene group, which is optionally substituted with one or more substituents selected from the group consisting of hydrogen (H), methyl (Me), i-propyl, t-butyl, phenyl, CN, $CF_3$, and diphenylamine ($NPh_2$).

9. An optoelectronic device comprising the organic molecule according to claim 1 as a luminescent emitter.

10. The optoelectronic device according to claim 9, wherein the optoelectronic device comprises at least one selected from the group consisting of:

organic light-emitting diodes (OLEDs),
light-emitting electrochemical cells,
OLED-sensors,
organic diodes,
organic solar cells,
organic transistors,
organic field-effect transistors,
organic lasers, and
down-conversion elements.

11. A composition, comprising:

(a) the organic molecule according to claim 1, as an emitter material and/or a host material, and
(b) an emitter material and/or a host material different from the organic molecule, and
(c) optionally, a dye and/or a solvent.

12. An optoelectronic device, comprising the composition according to claim 11, wherein the device comprises at least one selected from the group consisting of organic light-emitting diodes (OLEDs), light-emitting electrochemical cells, OLED-sensors, organic diodes, organic solar cells, organic transistors, organic field-effect transistors, organic lasers, and down-conversion elements.

13. The optoelectronic device according to claim 12, comprising:

a substrate,
an anode, and
a cathode, wherein the anode or the cathode is disposed on the substrate, and
a light-emitting layer between the anode and the cathode, and comprising the composition.

14. A method for producing an optoelectronic device, the method comprising depositing the composition according to claim 11 by a vacuum evaporation method or from a solution.

15. An optoelectronic device, comprising the organic molecule according to claim 1, wherein the device comprises at least one selected from the group consisting of organic light-emitting diodes (OLEDs), light-emitting electrochemical cells, OLED-sensors, organic diodes, organic solar cells, organic transistors, organic field-effect transistors, organic lasers, and down-conversion elements.

16. The optoelectronic device according to claim 15, comprising:

a substrate,
an anode, and
a cathode, wherein the anode or the cathode is disposed on the substrate, and
a light-emitting layer between the anode and the cathode and comprising the organic molecule.

17. A method for producing an optoelectronic device, the method comprising depositing the organic molecule according to claim 1 by a vacuum evaporation method or from a solution.

18. An organic molecule, comprising a structure represented by Formula I:

Formula I

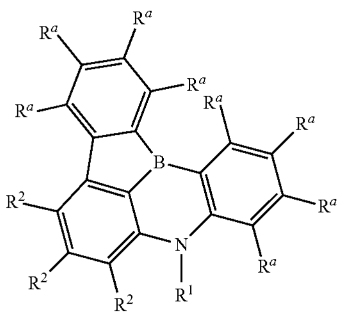

wherein in Formula I, $R^1$ represents a pyrene group, which is optionally substituted with one or more substituents $R^4$;

$R^a$ and $R^2$ are at each occurrence independently selected from the group consisting of:

hydrogen, deuterium, $N(R^3)_2$, $OR^3$, $SR^3$, $Si(R^3)_3$, $B(OR^3)_2$, $OSO_2R^3$, $CF_3$, CN, halogen;

$C_1$-$C_{40}$-alkyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_1$-$C_{40}$-alkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$:

$C_1$-$C_{40}$-thioalkoxy, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-alkenyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C═O, C═S, C═Se, $C{=}NR^3$, $P({=}O)(R^3)$, SO, $SO_2$, $NR^3$, O, S or $CONR^3$;

$C_2$-$C_{40}$-alkynyl, which is optionally substituted with one or more substituents $R^3$ and wherein one or more non-adjacent $CH_2$-groups are optionally substituted by $R^3C{=}CR^3$, C≡C, $Si(R^3)_2$, $Ge(R^3)_2$, $Sn(R^3)_2$, C=O, C=S, C=Se, $C{=}NR^3$, $P({=}O)(R^3)$, SO, $SO_2$, $NR^3$, O, S or $CONR^3$;

$C_6$-$C_{60}$-aryl, which is optionally substituted with one or more substituents $R^3$; and $C_3$-$C_{57}$-heteroaryl, which is optionally substituted with one or more substituents $R^3$;

$R^3$ is independently selected from the group consisting of:

hydrogen, deuterium, $N(R^4)_2$, $OR^4$, $SR^4$, $Si(R^4)_3$, $B(OR^4)_2$, $OSO_2R^4$, $CF_3$, CN, halogen;

$C_1$-$C_{40}$-alkyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_1$-$C_{40}$-alkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_1$-$C_{40}$-thioalkoxy, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_2$-$C_{40}$-alkenyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_2$-$C_{40}$-alkynyl, which is optionally substituted with one or more substituents $R^4$ and wherein one or more non-adjacent $CH_2$-groups are optionally substituted by $R^4C{=}CR^4$, C≡C, $Si(R^4)_2$, $Ge(R^4)_2$, $Sn(R^4)_2$, C=O, C=S, C=Se, $C{=}NR^4$, $P({=}O)(R^4)$, SO, $SO_2$, $NR^4$, O, S or $CONR^4$;

$C_6$-$C_{60}$-aryl, which is optionally substituted with one or more substituents $R^4$; and $C_3$-$C_{57}$-heteroaryl, which is optionally substituted with one or more substituents $R^4$;

$R^4$ is at each occurrence independently from one another selected from the group consisting of:

hydrogen, deuterium, halogen, OPh, SPh, $CF_3$, CN, $Si(C_1$-$C_5$-alkyl$)_3$, $Si(Ph)_3$;

$C_1$-$C_5$-alkyl, wherein optionally one or more hydrogen atoms are independently substituted by deuterium, halogen, CN, or $CF_3$;

$C_1$-$C_5$-alkoxy, wherein optionally one or more hydrogen atoms are independently substituted by deuterium, halogen, CN, or $CF_3$;

$C_1$-$C_5$-thioalkoxy, wherein optionally one or more hydrogen atoms are independently substituted by deuterium, halogen, CN, or $CF_3$;

$C_2$-$C_5$-alkenyl, wherein optionally one or more hydrogen atoms are independently substituted by deuterium, halogen, CN, or $CF_3$;

$C_2$-$C_5$-alkynyl, wherein optionally one or more hydrogen atoms are independently substituted by deuterium, halogen, CN, or $CF_3$;

$C_6$-$C_{18}$-aryl, which is optionally substituted with one or more $C_1$-$C_5$-alkyl substituents;

$C_3$-$C_{17}$-heteroaryl, which is optionally substituted with one or more $C_1$-$C_5$-alkyl substituents;

$N(C_6$-$C_{18}$-aryl$)_2$;

$N(C_3$-$C_{17}$-heteroaryl$)_2$; and $N(C_3$-$C_{17}$-heteroaryl$)(C_6$-$C_{18}$-aryl$)$;

wherein adjacent groups $R^a$ optionally are bonded to each other to form an aryl or heteroaryl ring, which is optionally substituted with one or more $C_1$-$C_5$-alkyl substituents, deuterium, halogen, CN or $CF_3$;

wherein adjacent groups $R^2$ optionally are bonded to each other to form an aryl or heteroaryl ring, which is optionally substituted with one or more $C_1$-$C_5$-alkyl substituents, deuterium, halogen, CN or $CF_3$; and wherein at least one hydrogen atom of the organic molecule may be substituted by a halogen atom or a deuterium atom.

* * * * *